(12) United States Patent
Yan

(10) Patent No.: US 9,736,907 B2
(45) Date of Patent: Aug. 15, 2017

(54) FACILITATING IMPROVED LUMINANCE UNIFORMITY IN ORGANIC LIGHT EMITTING DIODE DEVICE PANELS

(71) Applicant: City University of Hong Kong, Kowloon (HK)

(72) Inventor: Wei Yan, Sha Tin (HK)

(73) Assignee: CITY UNIVERSITY OF HONG KONG, Kowloon (HK)

( * ) Notice: Subject to any disclaimer, the term of this patent is extended or adjusted under 35 U.S.C. 154(b) by 92 days.

(21) Appl. No.: 14/465,604

(22) Filed: Aug. 21, 2014

(65) Prior Publication Data

US 2015/0334804 A1    Nov. 19, 2015

Related U.S. Application Data

(60) Provisional application No. 61/994,058, filed on May 15, 2014.

(51) Int. Cl.
*H05B 33/08* (2006.01)
*H01L 51/52* (2006.01)

(52) U.S. Cl.
CPC ..... *H05B 33/0896* (2013.01); *H01L 51/5203* (2013.01); *H01L 51/529* (2013.01); *Y02B 20/36* (2013.01)

(58) Field of Classification Search
USPC ..... 315/32, 50, 94, 112, 115, 117, 118, 307, 315/291, 297, 309
See application file for complete search history.

(56) References Cited

U.S. PATENT DOCUMENTS

2006/0292722 A1* 12/2006 Becker ................ H05K 1/0204
                                                        438/28
2012/0286298 A1* 11/2012 Pang .................. H01L 51/5203
                                                        257/88

OTHER PUBLICATIONS

Park et al., "Large-Area OLED Lightings and Their Applications," Semiconductor Science and Technology, 2011.
Wu et al., "Progress and Perspective of Polymer White Light-Emitting Devices and Materials," The Royal Society of Chemistry, May 2009, pp. 3391-3400.
Pohl et al., "Electro-Thermal Investigation of OLEDs," Sep. 2008, pp. 235-240, EDA Publishing/Therminic, Rome, Italy.
Kollar et al., "Electro-Thermal Modeling of Different LEP-Thickness White OLEDs", Oct. 2009, EDA Publishing/ Therminic, Leuven, Belgium.

(Continued)

*Primary Examiner* — Douglas W Owens
*Assistant Examiner* — Jianzi Chen
(74) *Attorney, Agent, or Firm* — Amin, Turocy & Watson, LLP

(57) ABSTRACT

An apparatus facilitating luminosity uniformity across an organic light emitting diode (OLED) device is provided. In one embodiment, the method includes: operating an organic light emitting diode (OLED) device including an anode; a semiconductor material coupled to the anode; and a cathode coupled to the semiconductor material. The method also includes dissipating heat of the OLED device in a defined pattern to increase a luminosity uniformity of the OLED device, wherein the dissipating the heat in the defined pattern comprises causing a first temperature value at a first region of the OLED device and causing a second temperature value at a second region of the OLED device.

21 Claims, 43 Drawing Sheets

(56) References Cited

OTHER PUBLICATIONS

Poppe et al.,"Methodology for Thermal and Electrical Characterization of Large Area OLEDs," Proceedings of 25th IEEE SemiTherm Symposium, 2009, pp. 38-44.

Tyan et al., "Organic Light-Emitting-Diode Lighting Overview," Journal of Photonics for Energy, 2011, vol. 1, Society of Photo-Optical Instrumentation Engineers (SPIE).

Neyts et al., "Inhomogeneous Luminance in Organic Light Emitting Diodes Related to Electrode Resistivity," Journal of Applied Physics, 2006, American Institute of Physics.

Barink et al., "Analytical Model for Current Distribution in Large-Area Organic Light Emitting Diodes with Parallel Metal Grid Lines," Journal of Applied Physics, 2012, American Institute of Physics.

Park et al., "Luminance Uniformity of Large-Area OLEDs With an Auxiliary Metal Electrode," Journal of Display Technology, Aug. 2009, pp. 306-311, vol. 5, No. 8.

Choi et al., "ITO-Free Large-Area Organic Light-Emitting Diodes with an Integrated Metal Grid," Optical Society of America, Jun. 2011, vol. 19, No. S4, Optics Express, Atlanta.

\* cited by examiner

FACILITATING IMPROVED LUMINANCE UNIFORMITY IN ORGANIC LIGHT EMITTING DIODE DEVICE PANELS

CROSS-REFERENCE TO RELATED APPLICATIONS

The present application claims the benefit of priority to U.S. Provisional Patent Application No. 61/994,058, filed May 15, 2014, and titled "A Simple Method to Improve the Luminance Non-Uniformity of OLEDs," the entire content of which is hereby incorporated herein by reference.

FIELD

The following description relates to organic light emitting diode (OLED) device panels, in general, and, for example, to facilitating improved luminance uniformity in OLED device panels.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

In one example embodiment, a method is provided. The method includes operating an organic light emitting diode (OLED) device including: an anode; a semiconductor material coupled to the anode; and a cathode coupled to the semiconductor material. The method also includes dissipating heat of the OLED device in a defined pattern to increase a luminosity uniformity of the OLED device, wherein the dissipating the heat in the defined pattern includes causing a first temperature value at a first region of the OLED device and causing a second temperature value at a second region of the OLED device.

In another example embodiment, another method is provided. The method includes powering an organic light emitting diode (OLED) device including: an anode; a semiconductor material coupled to the anode; and a cathode coupled to the semiconductor material, wherein the powering comprises operating the OLED device under a first power that is lower than a rated full power of the OLED device resulting in a first resistance value of an emitting area of the OLED device that is larger than a second resistance value of the emitting area of the OLED device under the rated power. The method also includes generating a substantially uniform luminosity across a surface of the OLED device based on the powering.

In yet another embodiment, another method is provided. The method includes emitting light from a device including an anode, a semiconductor material coupled to the anode, and a cathode coupled to the semiconductor material. The method also includes dissipating heat from the device from a substantially hollow component that is coupled to the cathode including reducing a temperature of the device causing a first temperature of the device to be a first value in a first region of the device and a second temperature of the device to be a second value in a second region of the device.

Toward the accomplishment of the foregoing and related ends, the one or more embodiments comprise features hereinafter fully described and particularly pointed out in the claims. The following description and the annexed drawings set forth herein detail certain illustrative embodiments of the one or more embodiments. These embodiments can be indicative, however, of but a few of the various ways in which the principles of various embodiments can be employed and the described embodiments can be intended to include all such embodiments and their equivalents.

DETAILED DESCRIPTION

Figure 1:
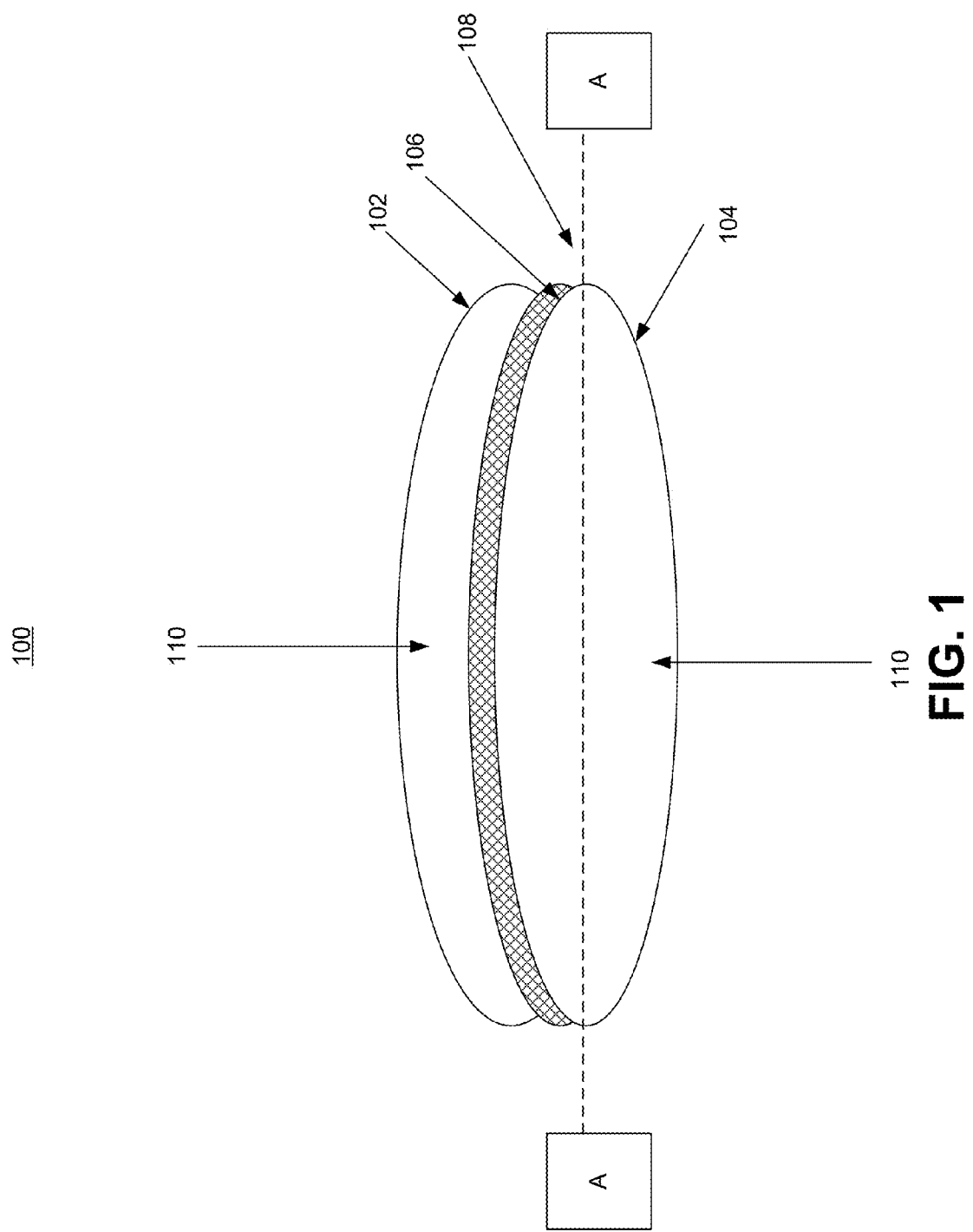
FIG. 1 is an example diagram of an OLED device in accordance with an embodiment described herein.

Various embodiments are now described with reference to the drawings, wherein like reference numerals are used to refer to like elements throughout. In the following description, for purposes of explanation, numerous specific details are set forth in order to provide a thorough understanding of one or more embodiments. In other instances, well-known structures and devices is shown in block diagram form in order to facilitate describing one or more embodiments. By way of example, but not limitation, bit numbers, model numbers, resolution, signal identifiers and names, and/or component model numbers may be transmitted in describing or illustrating various embodiments. It may be evident, however, that such embodiments may be practiced without these specific details. Further, all such alternative embodiments that achieve the functionality described herein are envisaged and within the scope of the embodiments disclosed.

OLEDs have become more popular as applications demanding efficient lighting have grown in number. OLEDs are unique in that they can be made as very thin, light-weight and naturally large area surface diffusing light sources. Different from an inorganic light emitting diode (LED), which is a point light source, OLED does not require a light diffusion sheet as OLEDs generate relatively low luminous intensity over a large area. OLEDs can be operated at lower luminous intensity while obtaining substantially the same luminous flux simply by expanding the emission area. This feature is desired since heat generation is maintained at a relatively low level, thereby facilitating the implementation of a flexible lighting system. This lighting system can enable customer-oriented (e.g., flexible in any size, location or positions) lighting. In addition to large area surface emission and/or flexibility, another appealing property of OLEDs lies in the transparency of OLEDs. These and other context about OLEDs may become further apparent after review of the various embodiments of the detailed description.

An OLED can be turned on or off instantly, dimmed and/or made to emit light of different colors. These features are attractive and can potentially create unique markets for OLEDs in decoration lighting. However, the real impact of OLED lighting will be in general lighting. The global general lighting market exceeds $90 billion in market size, and general lighting is where about one-sixth of the total electricity is consumed. Success in the general lighting market not only brings the most monetary benefits but also will have the most positive impact on the environment. To succeed in the general lighting market, OLED lighting must be competitive in performance and cost relative to existing and future lighting technologies (e.g., incandescent lamps, fluorescent lamps, compact fluorescent lamps (CFLs), and the forthcoming inorganic LEDs).

The performance of a lighting device is typically measured by lifetime and efficiency. Issues such as short circuits, luminance non-uniformity, hot spots, and heat generation are also factors taken into account in determining performance. Recent research has shown that the theoretical limit of efficacy for an all-phosphorescent single stack OLED device is 249 lumens per Watt (lm/W) and that for the hybrid double stack OLED device the limit of efficacy is 184 lm/W. So far, the reported OLED efficacy values are still much lower than the theoretical limit value. Normally, the efficacy and lifetime of lamps are directly affected by the heat generated during lamp operation. Like the conventional light sources (e.g., bulbs, fluorescent lamps, and inorganic LEDs), flat panel OLED lighting is not free from thermal-related issues. However, OLEDs have a very short heat transfer pathway between the internal heat source (e.g., light-emitting active area) and the outer device surface. As such, the heat difference between the internal heat source and the outer device surface is very small, which facilitates heat dissipation.

Moreover, the OLED lighting device is unique in that it is naturally a large area diffused light source. It does not need any fixtures to cut down the glare or to direct the light and hence suffers little or no fixture loss. Because the power is applied over a large area, the temperature rise is minimal. Even considering the potential loss in efficiency from the driver/power supply, the OLED-based luminaires are already very competitive in efficacy compared to luminaires using other lighting technologies. Since all other conventional lamps (includes LEDs) are either point or line sources with all the light coming from very small areas, they are extremely bright sources. In practical luminaires, fixtures have to be used to cut down the glare or to distribute the light. The use of fixtures can cause significant difference between the efficacy of a source and the efficacy of the luminaire using the source in actual operations. For example, the LEDs in actual use are continuously on and the current density is usually very high. These operating conditions in the luminaires cause significant heating of the LEDs. This is particularly true if the LED package and the luminaire do not have adequate heat sinking. Because LED performance is very sensitive to temperature, the performance of LED luminaires can be much lower than that of the LED packages. Therefore, OLED devices are already competitive in efficacy and there is potential for still further improvement. As luminaires, however, the lifetime and the cost of OLED devices can be improved. OLED devices can be cost-effective when volume manufacturing begins and with improved manufacturing technology.

OLEDs have various features, which result in opportunities to use OLEDs in ways never before thought possible. For example, a transparent OLED lighting panel can be integrated with a transparent solar cell to build a self-powered light-emitting window; an electronic wall paper or carpet. For instance, one example approach for improving performance is addressing luminous non-uniformity. Accordingly, in one non-limiting aspect, one or more embodiments herein provide systems and apparatus that facilitate improved luminous uniformity in OLED devices.

FIG. 1 is a diagram of an OLED device in accordance with an embodiment described herein. OLED device 100 includes anode 102, cathode 104 and an organic semiconductor 106 coupled between anode 102 and cathode 104. Cross-section A-A 108 is provided across anode 102, cathode 104 and organic semiconductor 106 for further illustration with reference to FIGS. 1, 2, 3 and 4. As shown, cross-section A-A 108 is provided substantially through a center line of surface 110 of OLED device 100.

The light non-uniformity problem of OLEDs can be attributed to the low conductivity transparent material of the electrodes. To have the light emitted from the OLEDs, at least one of the electrodes, either anode 102 or cathode 104, should be substantially transparent. However, irrespective of the type of transparent conductor applied to the electrode, such as Indium Tin Oxide (ITO) or Poly(3,4-ethylenedioxythiophene) Polystyrene sulfonate (PEDOT:PSS), conductivity may still be much lower than the conductivity of metals. For large area OLEDs, this leads to an inhomogeneous potential and current distribution over the OLEDs. The injected current from the edge of the panel may just barely reach the central region of the panel in some instances. As such, the light emission distribution becomes non-uniform. This non-uniformity light distribution problem can be exacerbated with increased OLED panel area and/or increased luminance intensity.

The ratio between the effective horizontal resistance of anode 102 and the vertical resistance of the organic semiconductor 106 can be evaluated. If the vertical resistance of the organic semiconductor 106 is lower than the effective horizontal resistance of anode 102, most of the current will typically flow through the organic semiconductor 106 near the OLED panel edge. In this case, in the embodiments described herein, to achieve vertical resistance of the organic semiconductor 106 being larger than the effective horizontal resistance of anode 102, the vertical organic semiconductor resistance value can be increased. In some embodiments, the vertical organic semiconductor resistance value can be increased by increasing the thickness of OLED organic semiconductor 106 or employing the aid of a cooling device (e.g., a heat sink) (not shown) provided in tandem with OLED device 100, as discussed infra.

In another embodiment, to achieve vertical resistance of organic semiconductor 106 being larger than the effective horizontal resistance of anode 102, the horizontal resistance of anode 102, which can be substantially transparent in some embodiments, can be reduced by employing a highly conductive auxiliary metal electrode (e.g., chrome (Cr)) deposited and grid patterned on the ITO material. In this case, current first flows through the low-resistance auxiliary metal lines to the central region of OLED device 100 and then diffuses into the ITO material, producing substantially homogeneous light over a large area. In addition, the current density (luminous intensity) over a large area can be expected to increase. Notwithstanding such, the luminance uniformity typically varies depending on the sensitivity of the configuration of OLED device 100.

In another embodiment, to achieve vertical resistance of organic semiconductor 106 being larger than the effective horizontal resistance of anode 102, the metal line can be patterned as widely as possible to reduce the effective horizontal resistance of anode 102. The selection of the width of the auxiliary metal lines can be made considering that the gross emission area (i.e., the aperture ratio) is typically decreased with increasing metal coverage.

In yet another embodiment, the non-uniformity of light emission can be addressed by enhancing uniformity via different driving techniques. For example, in some embodiments, the emission area can be divided into sections, each (or one or more) of which can be controlled by a driving circuit. In one embodiment, the luminance of each section can be tuned and thus the luminance uniformity can be boosted.

In another embodiment, the luminance uniformity can be enhanced by reducing contact resistance between OLED electrodes and driving boards. The contact area between the OLED electrodes and driving boards can be large such that current is injected into the OLED panel from different direction, or in some embodiments, from the top, bottom, left and right of the panel of the OLED device. As used herein, the "top," "bottom," "left" and "right" of the panel of the OLED device shall mean the respective standard definitions of "top," "bottom," "left" and "right" while facing the panel of the OLED device.

Figure 2:
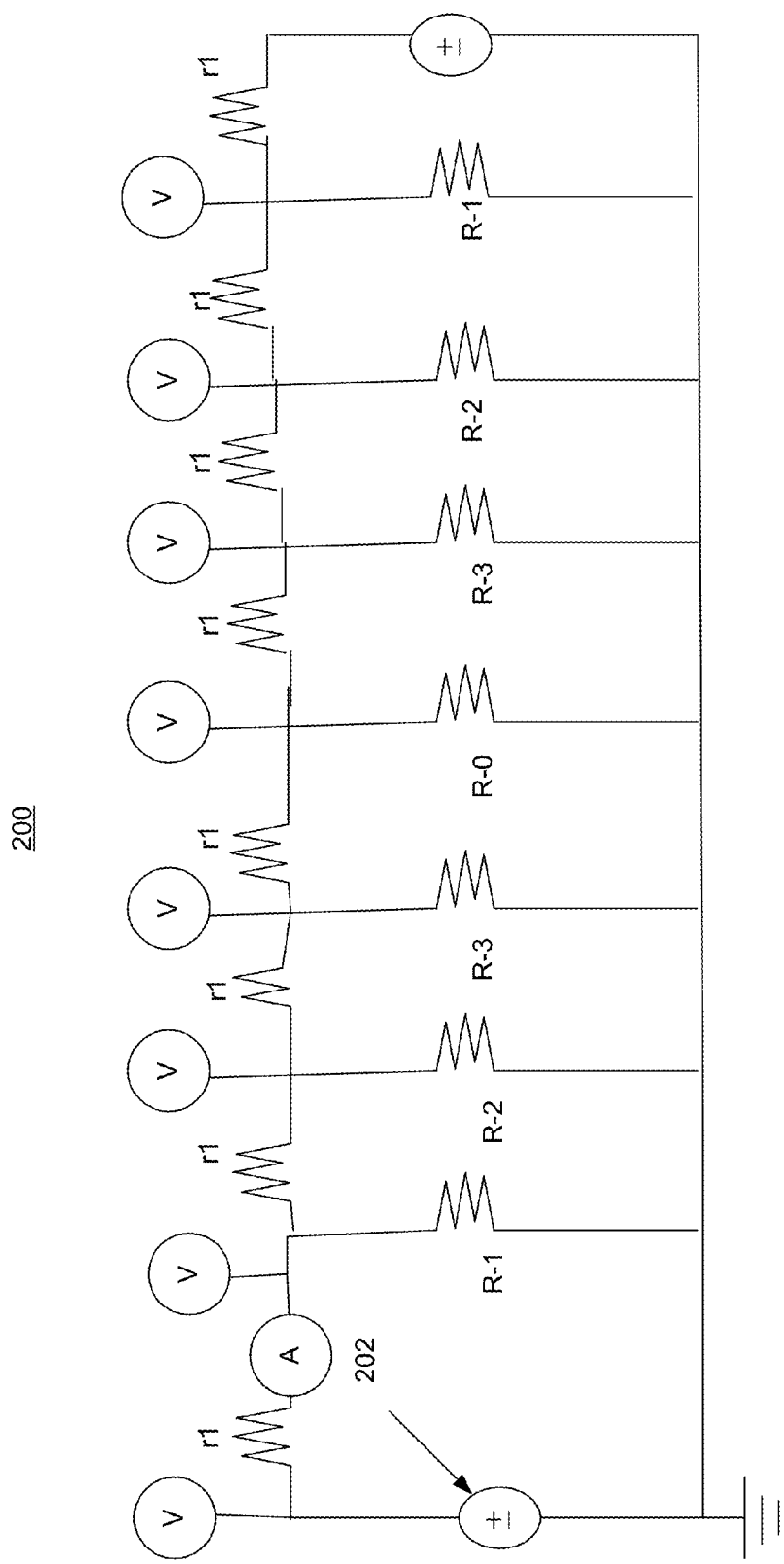
FIG. 2 is an example circuit diagram of a distributed resistance circuit model for an OLED device driven by a direct current (DC) power supply in accordance with an embodiment described herein.
Figure 3:
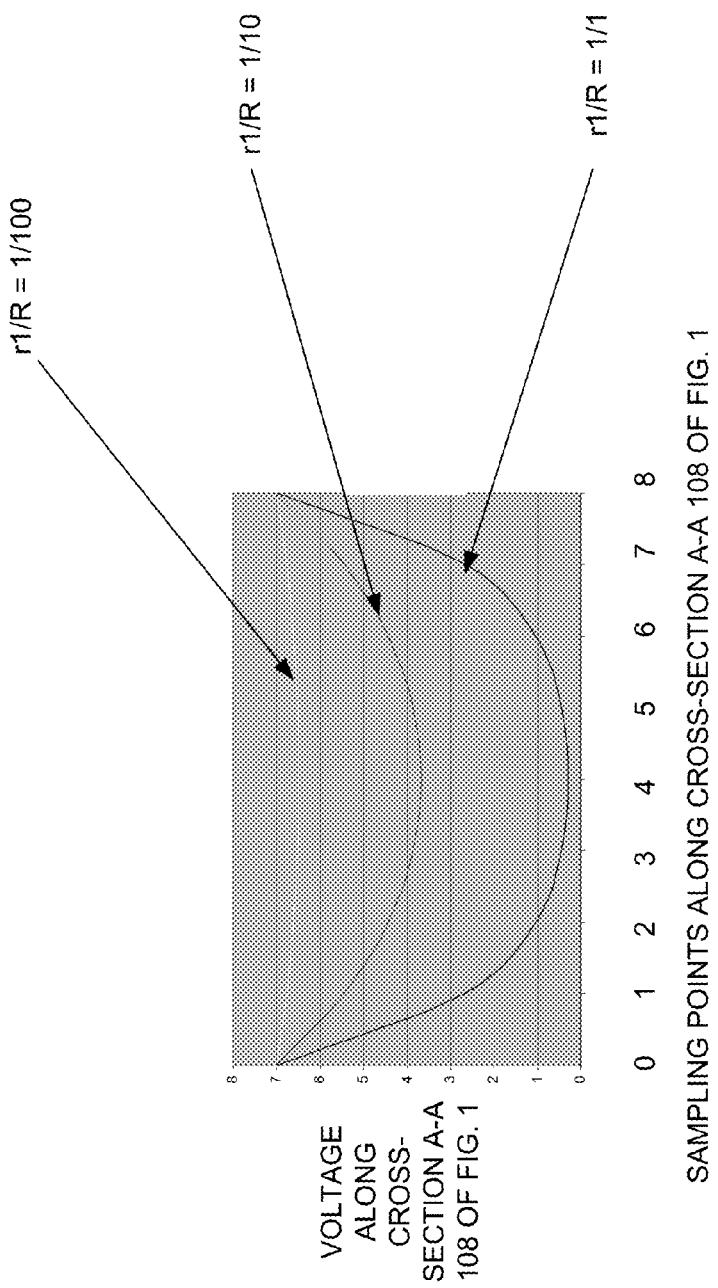
FIG. 3 is an example graph of a simulation result for a distributed line under DC condition in accordance with an embodiment described herein.
Figure 4:
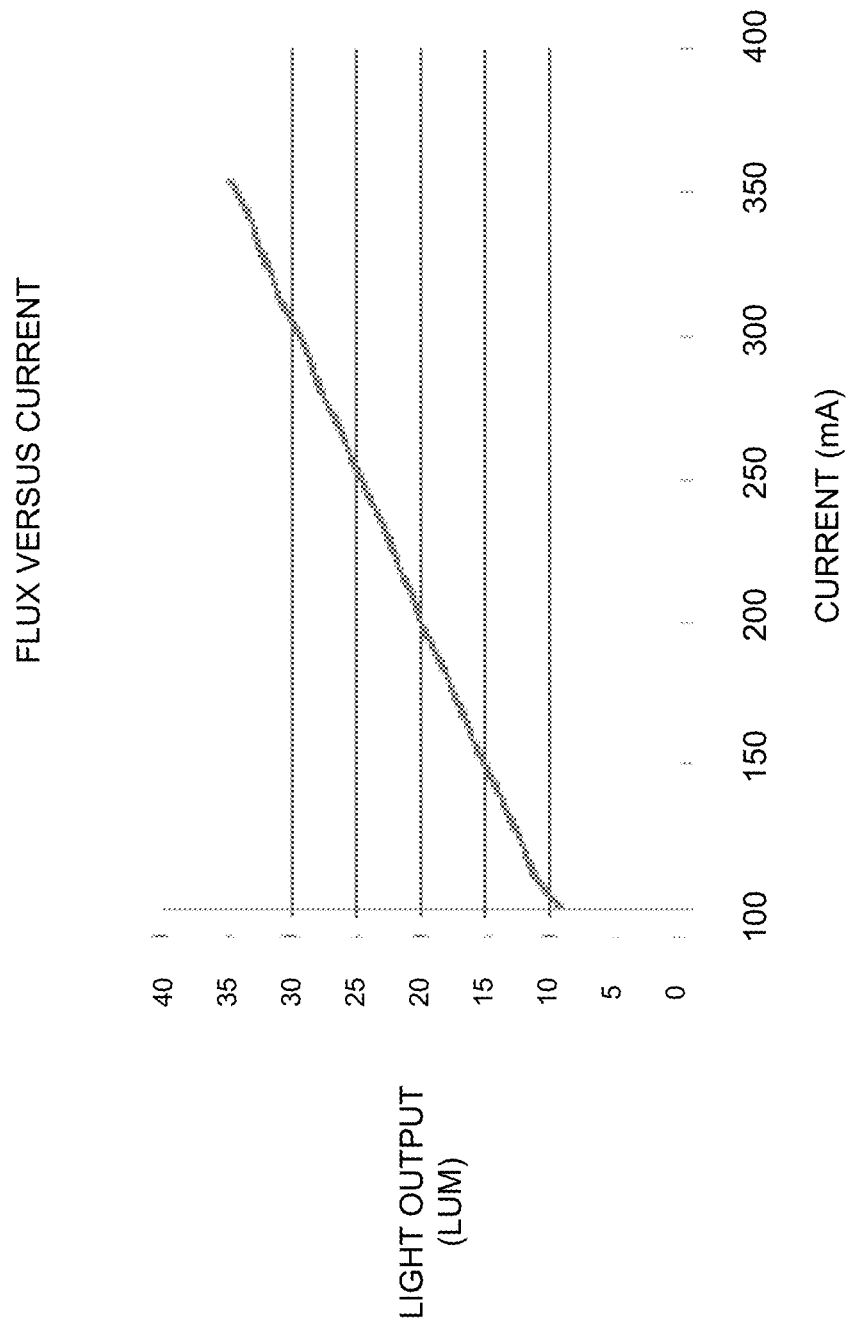
FIG. 4 is an example graph of experimental flux versus current result for an OLED sample in accordance with an embodiment described herein.

In another embodiment, considering the substantially equal potential around the circumference, a simplified distributed resistor circuit OLED lamp model can be provided along cross section A-A 108 of OLED device 100. FIG. 2 is a circuit diagram of such a distributed resistor model for an OLED device driven by a direct current (DC) power supply in accordance with an embodiment described herein. FIG. 3 is a graph of voltage versus sampling points along cross-section A-A 108 of the OLED device of FIG. 1. FIG. 4 is a graph of experimental luminous flux versus current result for an OLED device sample in accordance with an embodiment described herein.

Turning now to FIGS. 2 and 3, FIG. 3 shows simulation results for a distributed line under DC conditions in accordance with an embodiment described herein. The circuit model can be as shown in FIG. 2, where r1 represents anode 102, and thus represents ITO material surface resistance per unit area, and R represents the organic semiconductor 106 resistance per unit volume. The cathode (e.g., cathode 104 of FIG. 1) normally is considered as a good conductor. In this simulation, the organic semiconductor 106 resistance per unit volume is assumed to have approximately the same value in any part of OLED device 100. Thus, with reference to FIGS. 2 and 3, R-1=R-2 . . . =R-0 results.

With reference to FIGS. 1, 2 and 3, the simulation result shown in FIG. 3 is based on the assumption that the applied DC voltage 202 is equal to approximately 7 volts (V). As such, the voltage drop along cross section A-A 108 is largest when the ratio of r1/R is 1/1 and the voltage drop along cross-section AA 108 is smallest when the ratio of r1/R is 1/100. Therefore, if the surface resistance value of the ITO material is much smaller than the resistance of the organic semiconductor 106 the voltage drop along cross-section A-A 108 (which is along the center of OLED device 100) will be reduced significantly. Otherwise, the voltage drop in the center of OLED device 100 will tend to be much smaller than the voltage drop in areas along the periphery of OLED device 100. Under this condition, the current distribution along cross-section A-A 108 will typically not be uniform. The current value along the periphery of OLED device 100 is typically larger than the current value in the center area of OLED device 100 (e.g., along cross-section A-A 108).

Turning now to FIG. 4, as shown, light output (luminance) of OLED device 100 is in proportion with the lamp current of OLED device 100. Therefore, the luminance of the OLED will not be uniform. The periphery area is brighter than the center area, which has been observed from the tested OLED device samples.

One embodiment for facilitating uniform luminance can be as described with reference to FIGS. 5, 7-19, Equations 1 and 2 and Tables 1 and 2. In the above simulation, the resistance of organic semiconductor 106 is assumed to be the same value in any part of OLED device 100. Under this assumption, the voltage drop along the cross-section A-A 108 can cause the current distribution along cross-section A-A 108 to be non-uniform.

Figure 40:
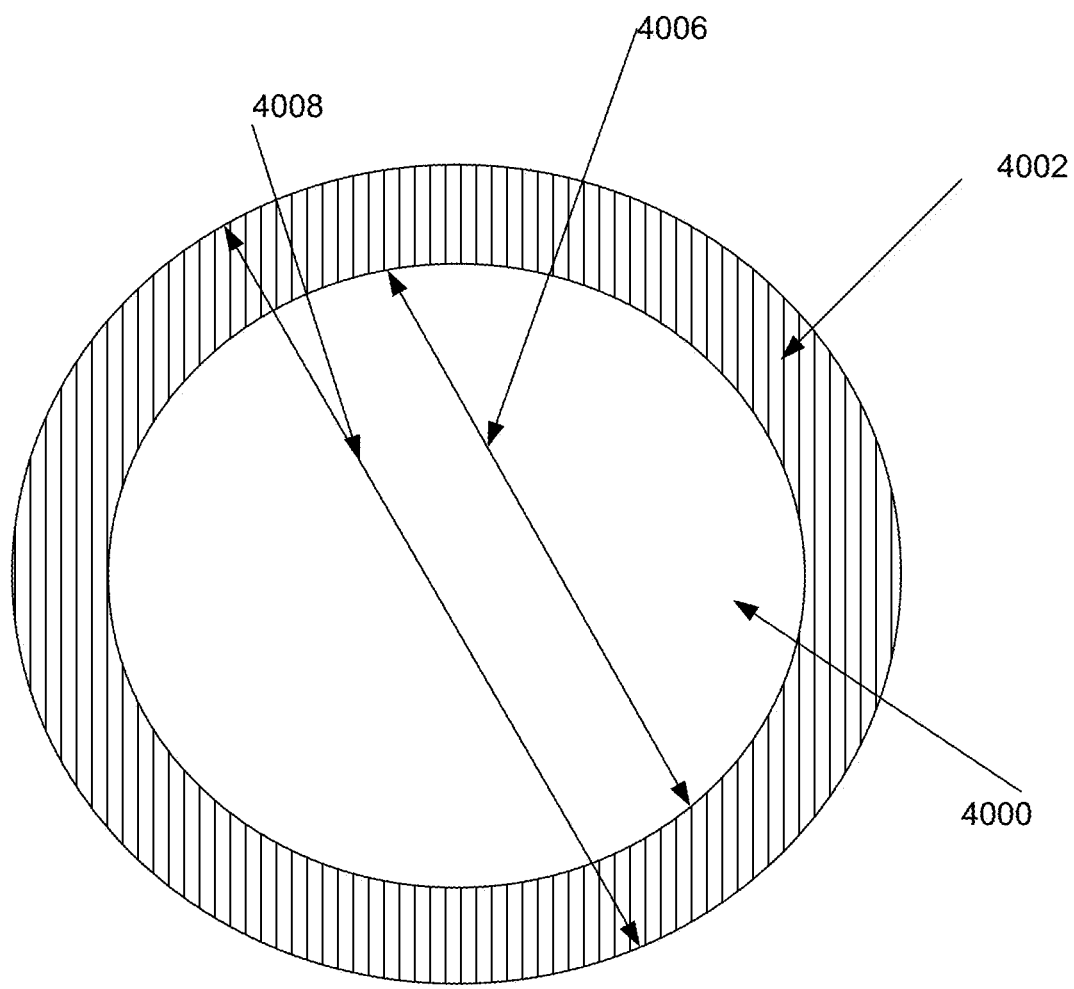
FIG. 40 is another example diagram of an OLED device in accordance with an embodiment described herein.
Figure 43:
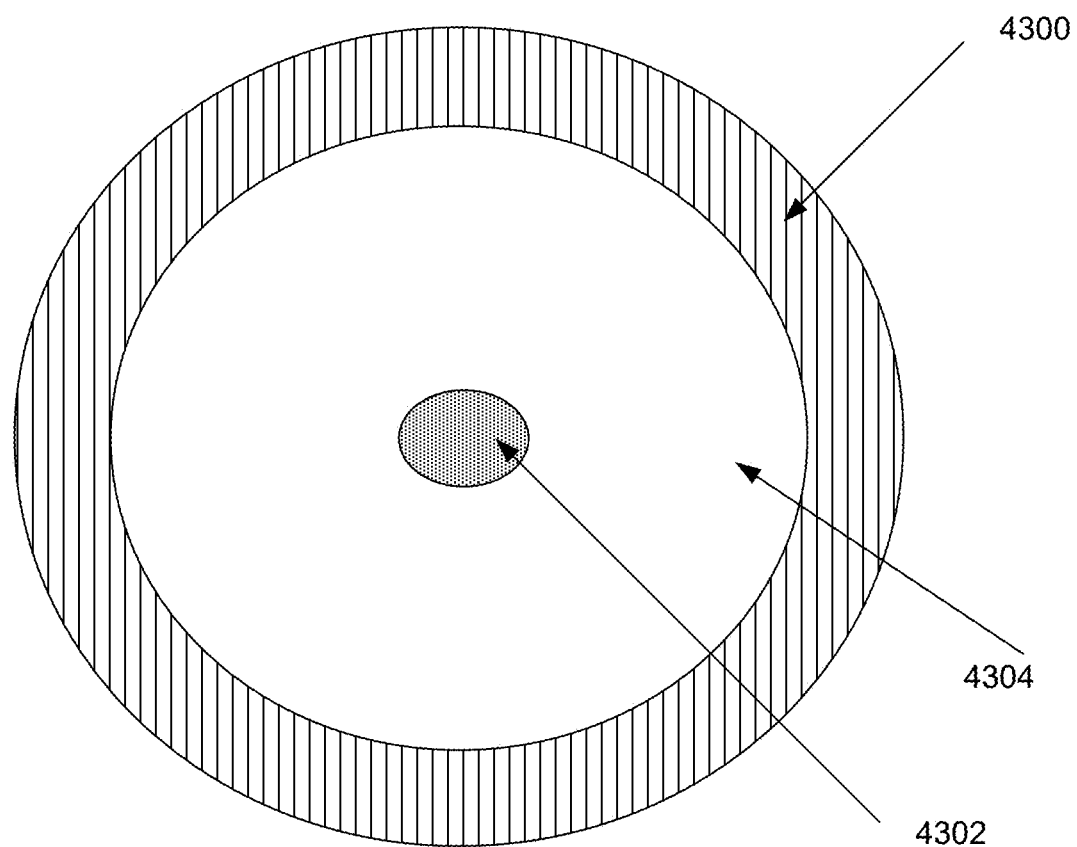
FIG. 43 is an example diagram of the OLED device of FIG. 40 illustrating the center and the periphery area of the OLED device in accordance with an embodiment described herein.

To obtain a uniform (or substantially uniform) current distribution along cross-section A-A 108, a distribution of the resistance value should be such that the resistance value is the smallest in the center part of OLED device 100 and is greatest in the periphery area of OLED device 100. FIG. 43 is an example diagram of the OLED device of FIG. 40 illustrating the periphery area of the OLED device in accordance with an embodiment described herein. The term "periphery" can include one or more of the areas shown in FIG. 43.

In FIG. 43, shaded area 4300 represents the periphery part of the light emitting area of OLED device 100 while shaded area 4302 can represent the center of the light emitting area of OLED device 100. The non-shaded area 4304 inside shaded area 4300 can be the rest part of the light emitting area of OLED device 100. In the embodiment shown and describe, the periphery of OLED device 100 does not include the area that is outside of OLED device 100. In particular, the periphery of OLED device 100 is the narrow area from the edge of OLED device 100 towards the center of OLED device 100. As mentioned, in the embodiment shown, the periphery is shaded area 4300.

Figure 5:
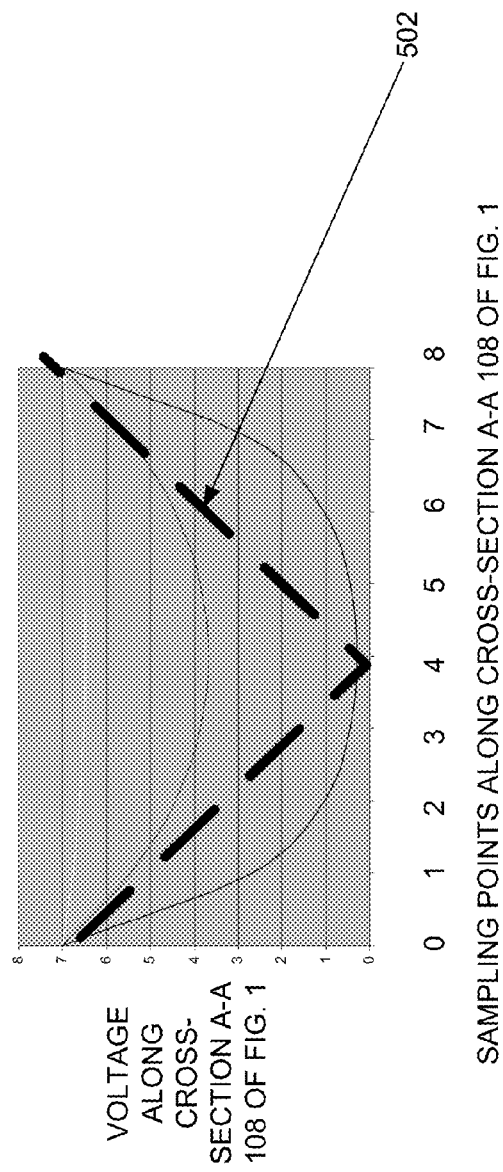
FIG. 5 is an example graph illustrating an idealized voltage drop for improved luminosity uniformity in accordance with an embodiment described herein.

With reference to the voltage drops at different sampling points shown in FIG. 3, shown is a parabolic voltage drop for the case when r1/R=1/1. FIG. 5 is a graph illustrating an idealized simulation result for improved luminosity uniformity in accordance with an embodiment described herein.

As compared to FIG. 3, FIG. 5 is a graph illustrating an idealized voltage drop for improved luminosity uniformity in accordance with an embodiment described herein. As shown, voltage 502 shows a drop having a distribution shape of "V" (e.g., highest voltage near sampling points near 0, 1, 7, 8; and smallest voltage at sampling points 4 where the voltage drops linearly with the sampling point location with the sampling points at 3, 4, 5 being closer to the center and the sampling points 0, 1, 7, 8 being closer to the periphery of OLED device 100). The location of the sampling points 0 to 8 on the OLED device surface can be found in FIG. 44.

When the voltage distribution has the shape "V," as shown in FIG. 5, the resistance distribution should also have substantially the same shape of "V." As a result, the current distribution would be almost uniform as the current distribution can then substantially offset the typical performance of having highest current in the periphery and lowest current in the center of OLED device 100 near cross-section A-A 108.

To obtain resistance distribution inside the emitting material of OLED device 100 in the shape of "V," in some embodiments, the following approach can be taken. The resistance value of the emitting material is typically a function of the temperature, i.e., R~1/T, where R is the resistance and T is the temperature. When the applied voltage value reaches the threshold value of OLEDs, the current will be injected into OLED device 100. The current flow in OLED device 100 typically causes Joule heating, which typically results in heat generation inside OLEDs. The heat flow in OLEDs can be expressed as Equation 1:

$$C\frac{\partial T(x,t)}{\partial t} = \frac{\partial}{\partial x}\left[k(x,t)\frac{\partial T(x,t)}{\partial x}\right] + \left[\frac{J_n(x,t)^2}{q\mu_n(x,t)n(x,t)} + \frac{J_p(x,t)^2}{q\mu_p(x,t)p(x,t)}\right] \quad (1)$$

where, in Equation 1, T represents the temperature, k represents the thermal conductivity, C represents the volumetric heat capacitance, J represents the current density, $\mu$ represents the carrier mobility, n represents the electron density, and p represents the hole density. As expressed in Equation 1, the Joule heating (the second term on the right-hand side of Equation 1) is induced by high current injection during operation. As such, as the current increases, heat flow will cause the temperature to increase. Concurrently, heat distribution along cross-section A-A 108 can become non-uniform since the heat conduction area is different. The temperature in the center location of OLED device (e.g. at cross-section A-A 108) is the highest since the conduction area is the smallest and the current density is the highest. Therefore, under normal conditions, the resistance value should be the smallest in the center and the largest in the periphery area. The condition to achieve the uniform current distribution is to obtain the temperature distribution shape "Λ," which is the converse of the desired resistance distribution over OLED device 100. However, in some embodiments, although the temperature distribution has shape "Λ," the current distribution is still not uniform under the normal operating condition.

In the embodiments described herein, operating conditions can be changed to affect temperature distribution inside OLED device 100 and obtain an improvement in luminance uniformity of OLED device 100. In various embodiments, the operating conditions that can be changed include position of OLED device 100 and/or cooling condition of a device employed in tandem with OLED device 100.

Figure 6:
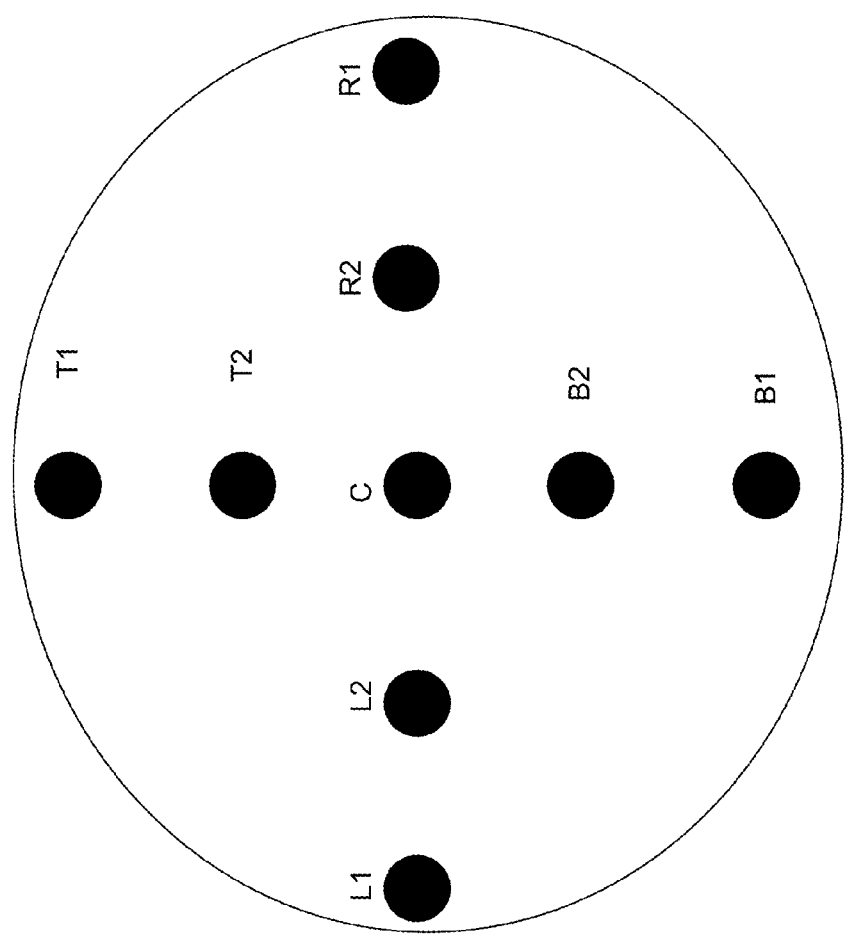
FIG. 6 is an example block diagram of sampling points on tested OLED devices in accordance with an embodiment described herein.
Figure 7:
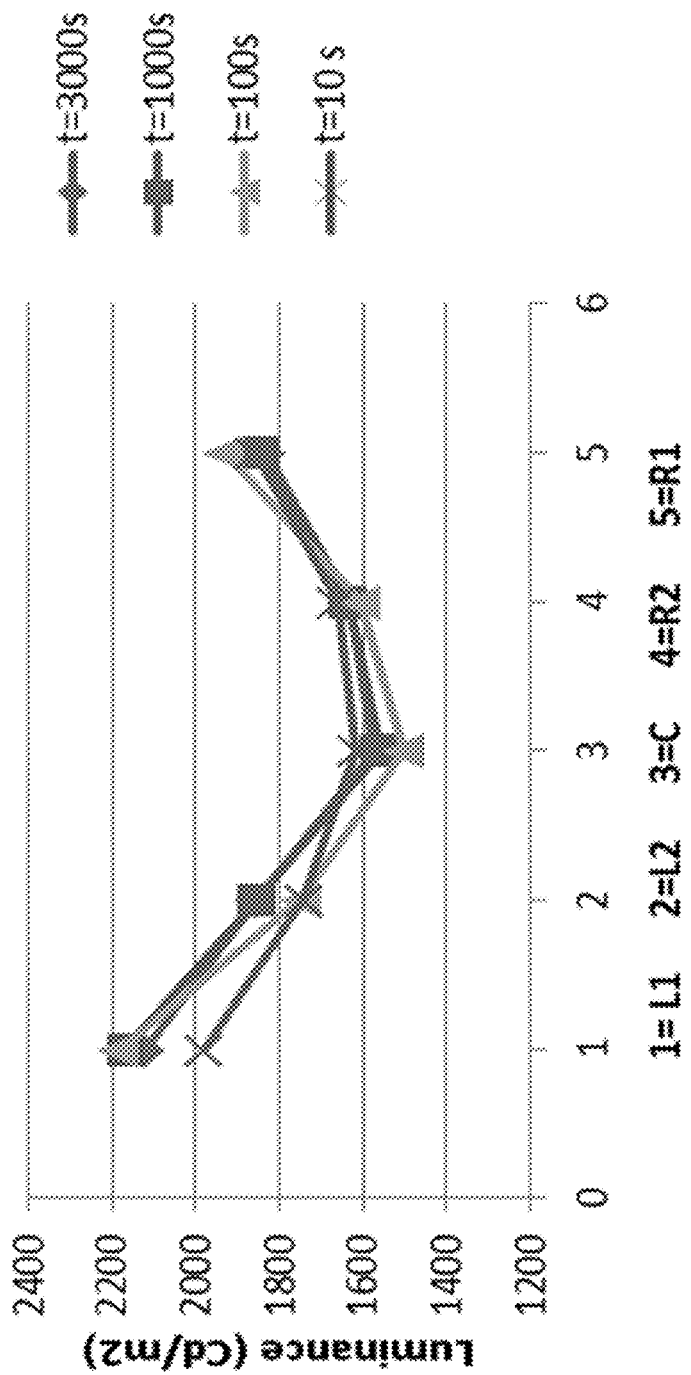
FIGS. 7-10 are example graphs of luminance and temperature performance for OLED device samples operated in a horizontal orientation in accordance with an embodiment described herein.
Figure 8:
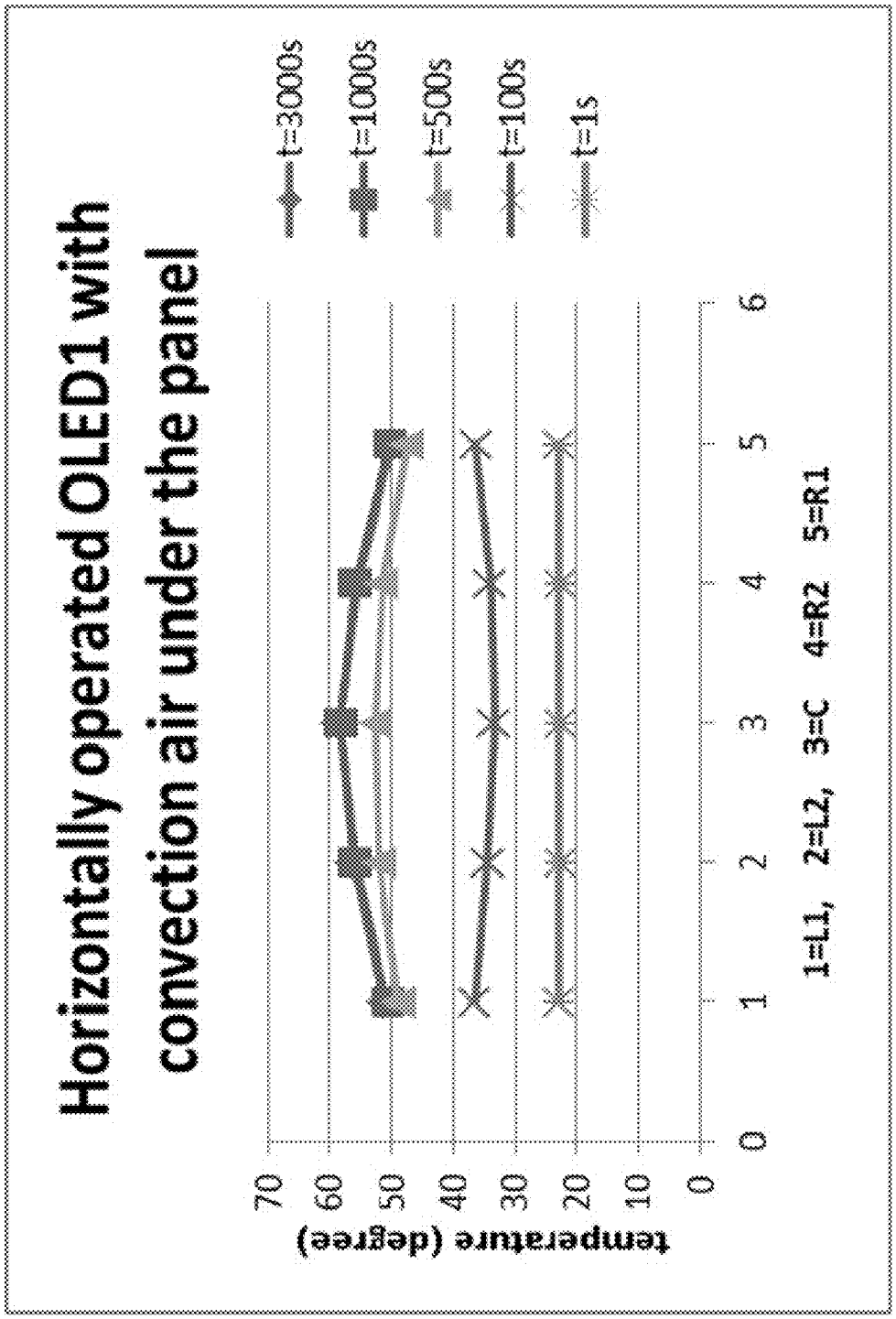
Figure 9:
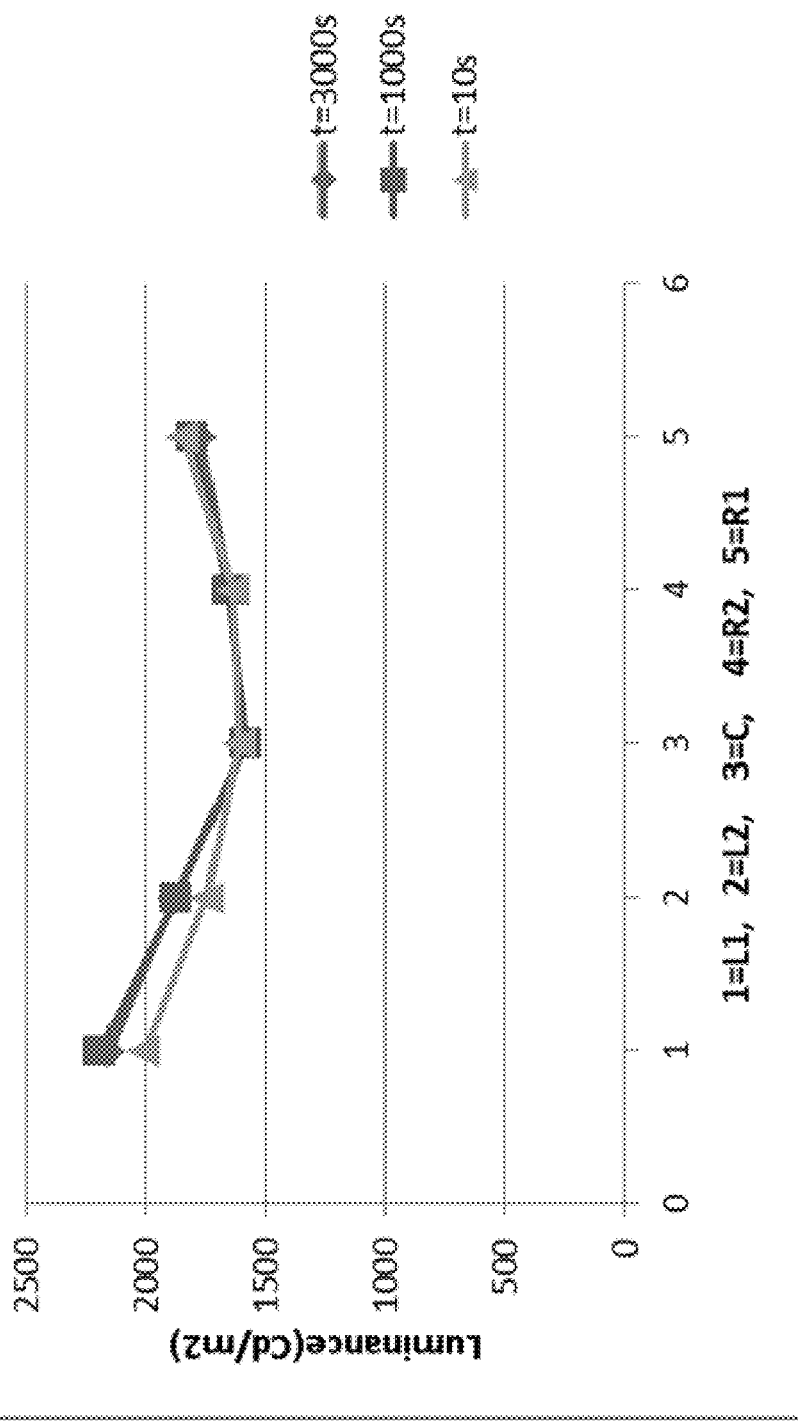
Figure 10:
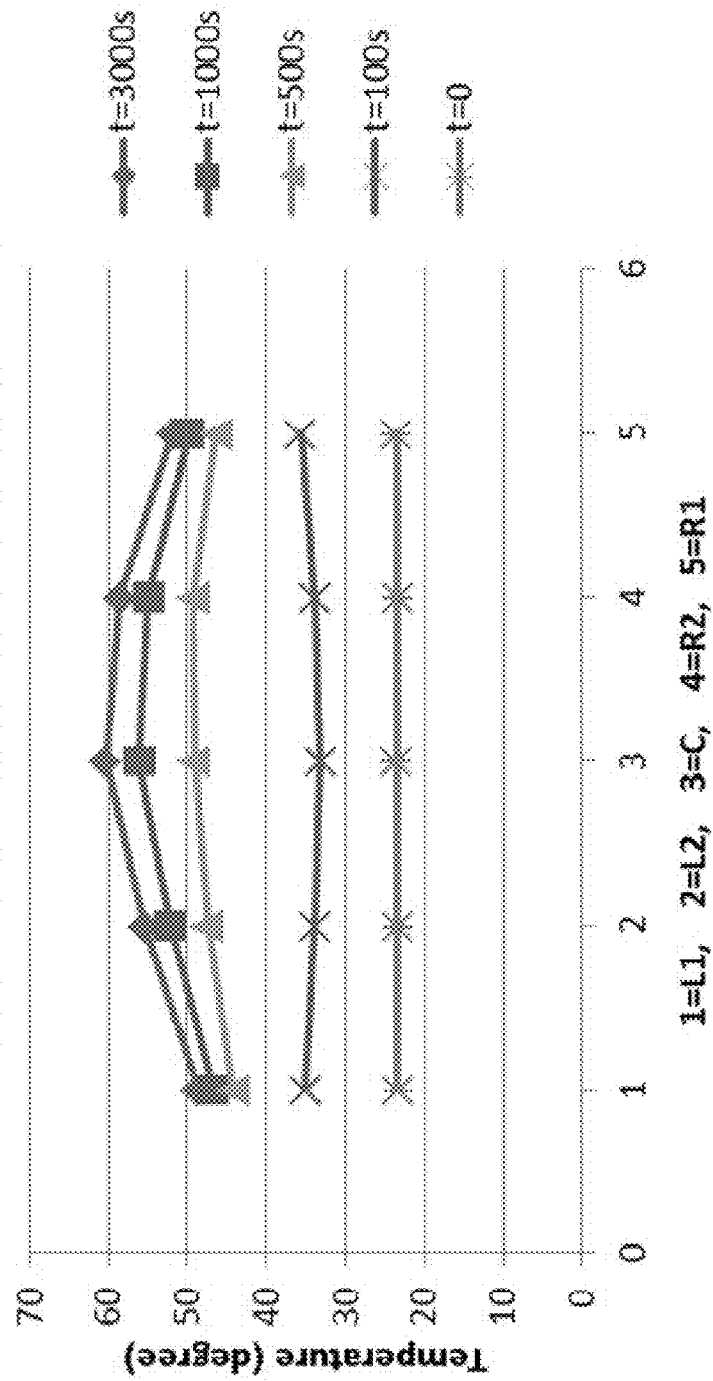
Figure 11:
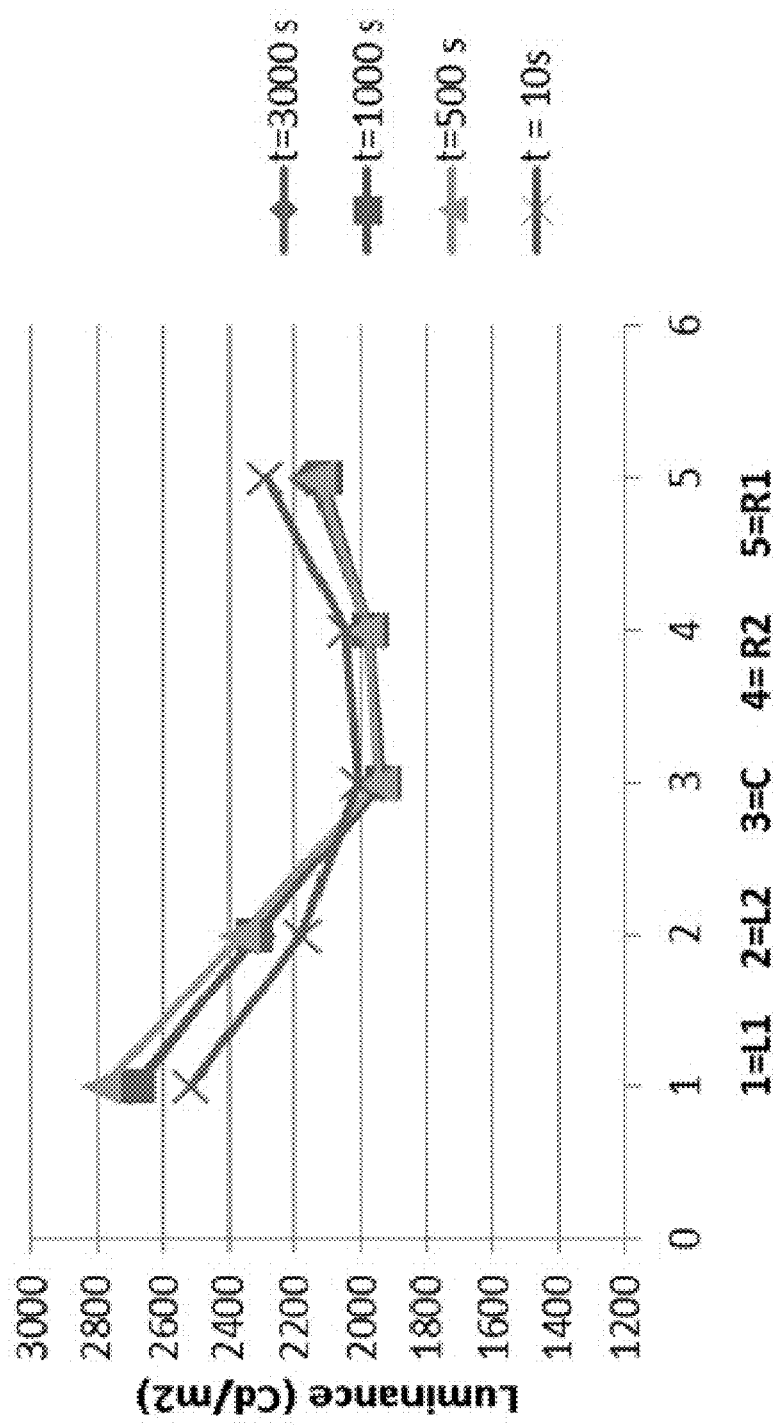
FIGS. 11-14 are example graphs of luminance and temperature performance for OLED device samples operated in a vertical orientation in accordance with an embodiment described herein.
Figure 12:
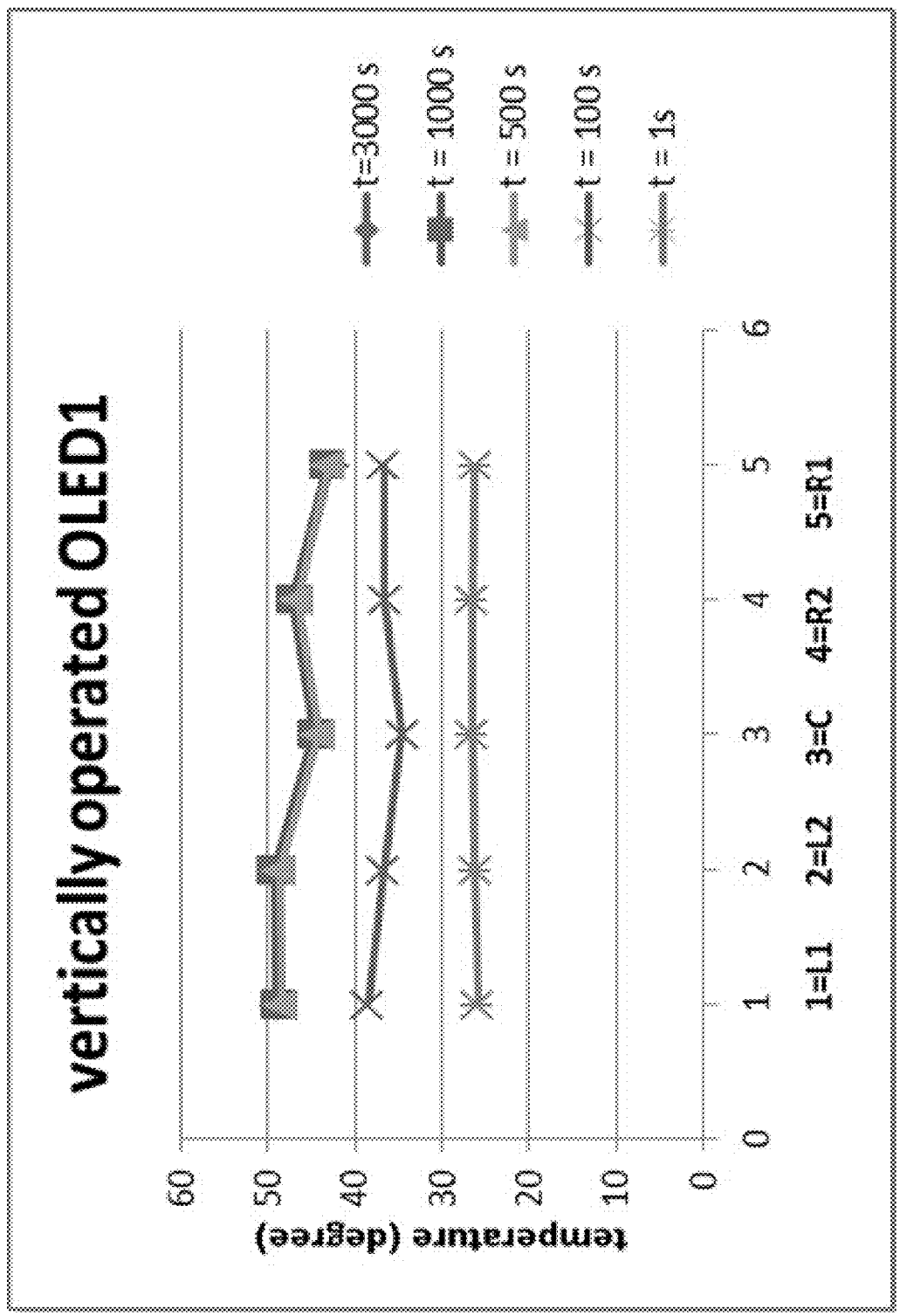
Figure 13:
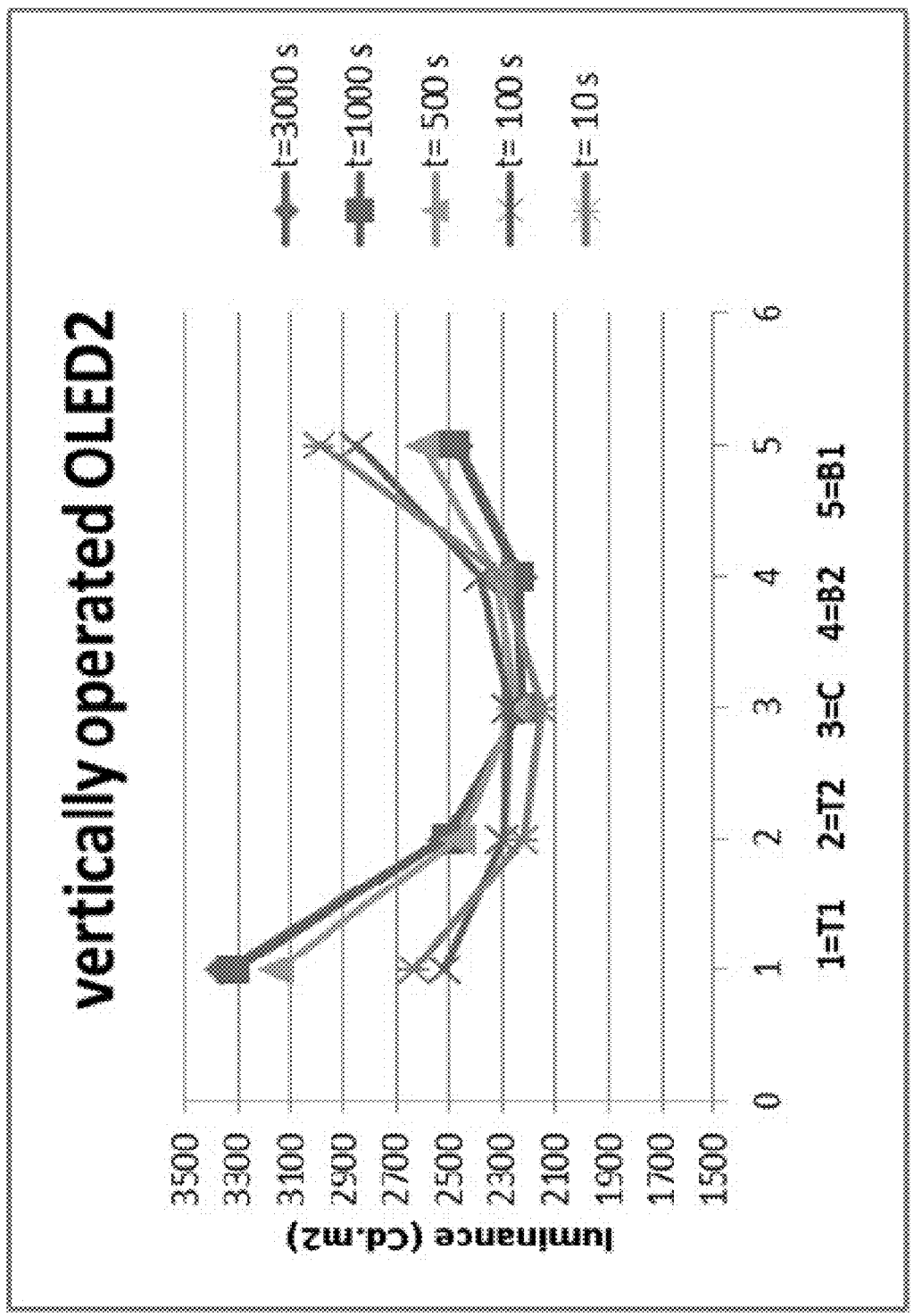
Figure 14:
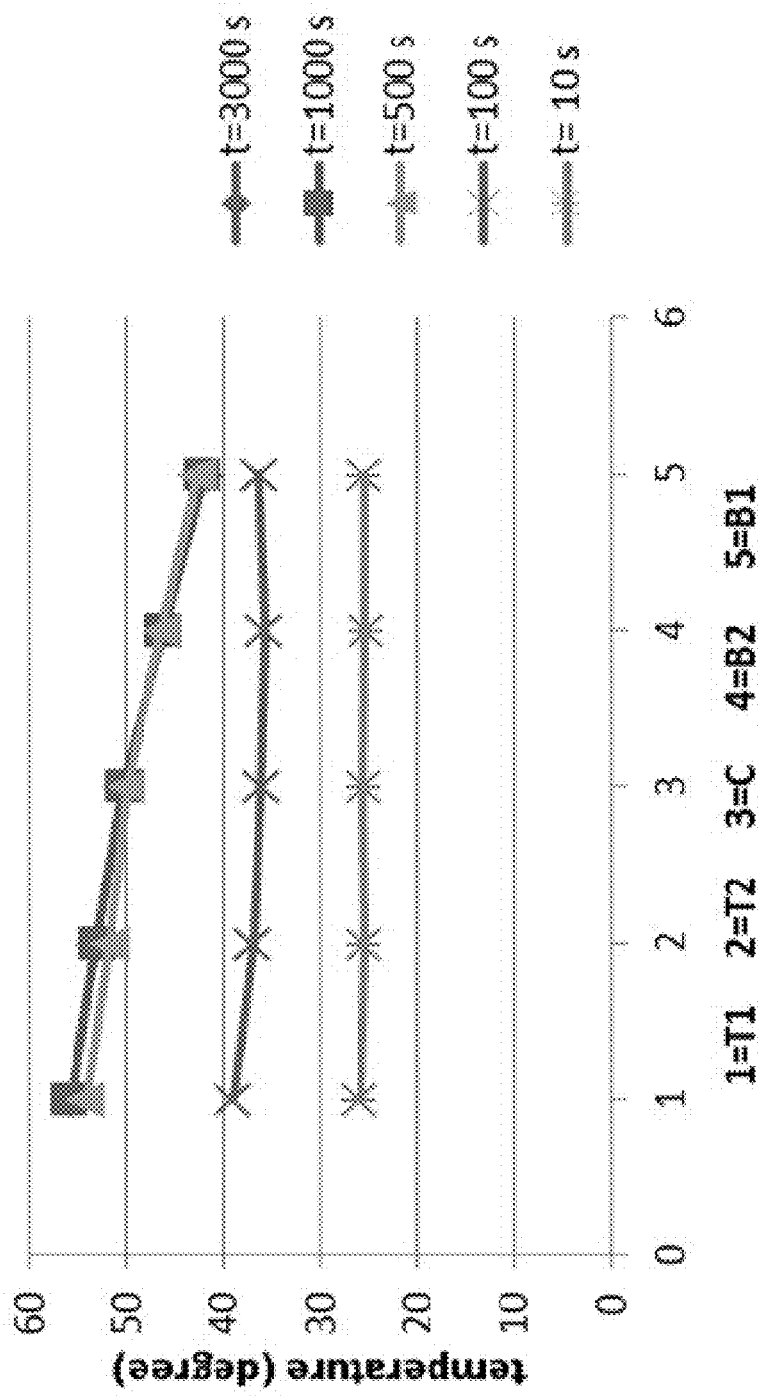
Figure 15:
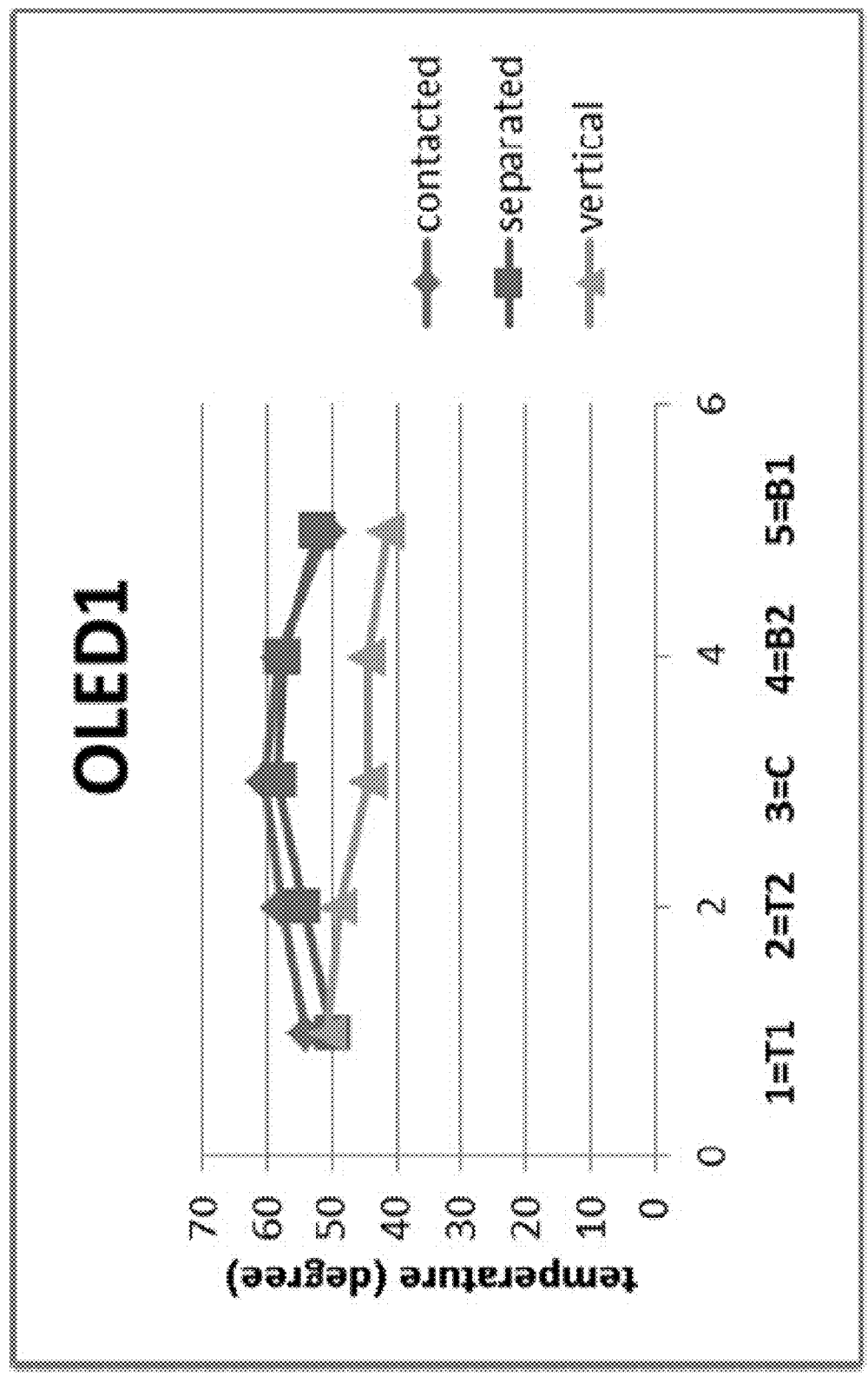
FIGS. 15-18 are example graphs of luminance and temperature performance when the OLED device has different operating orientations in accordance with an embodiment described herein.
Figure 16:
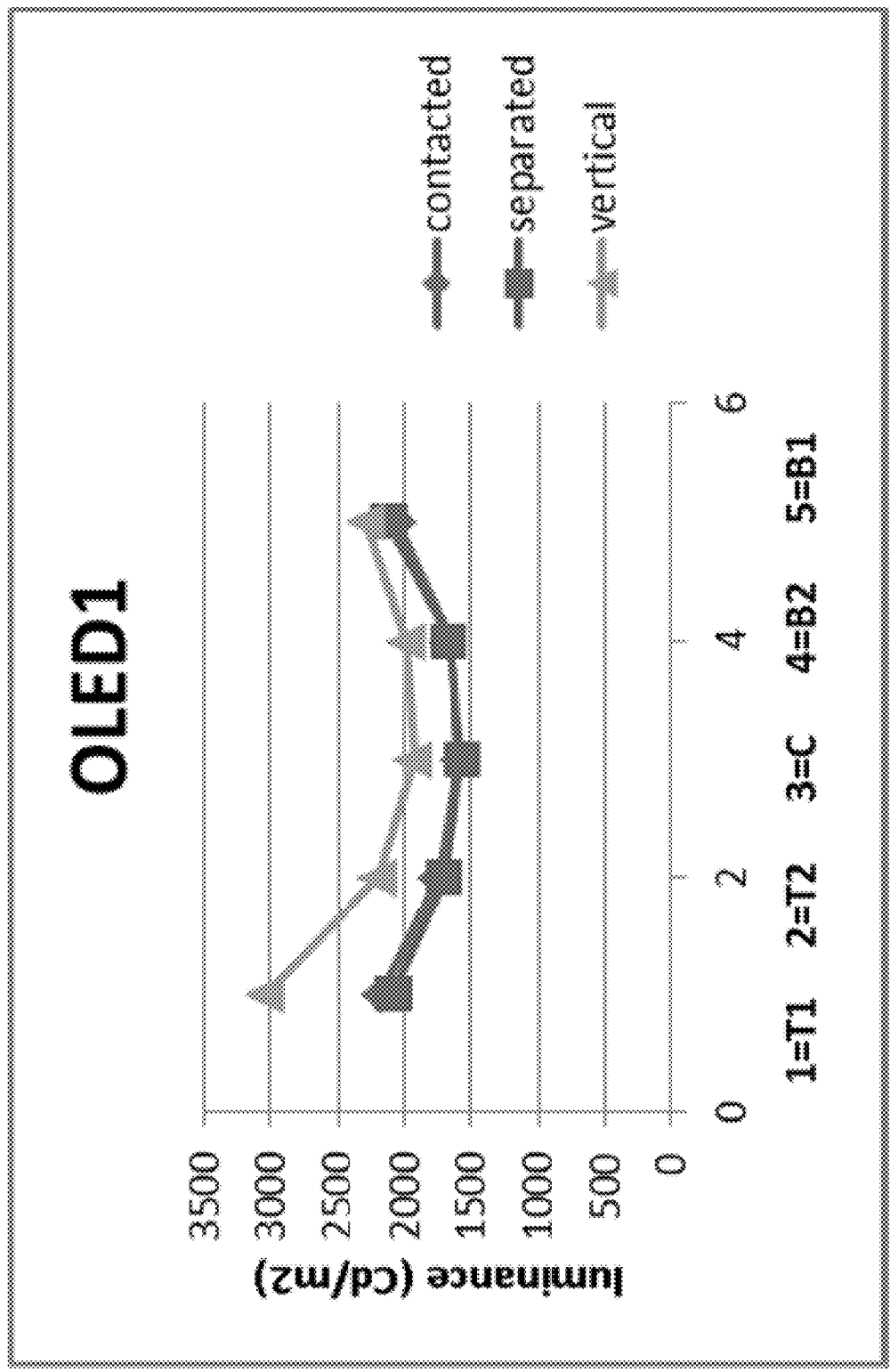
Figure 17:
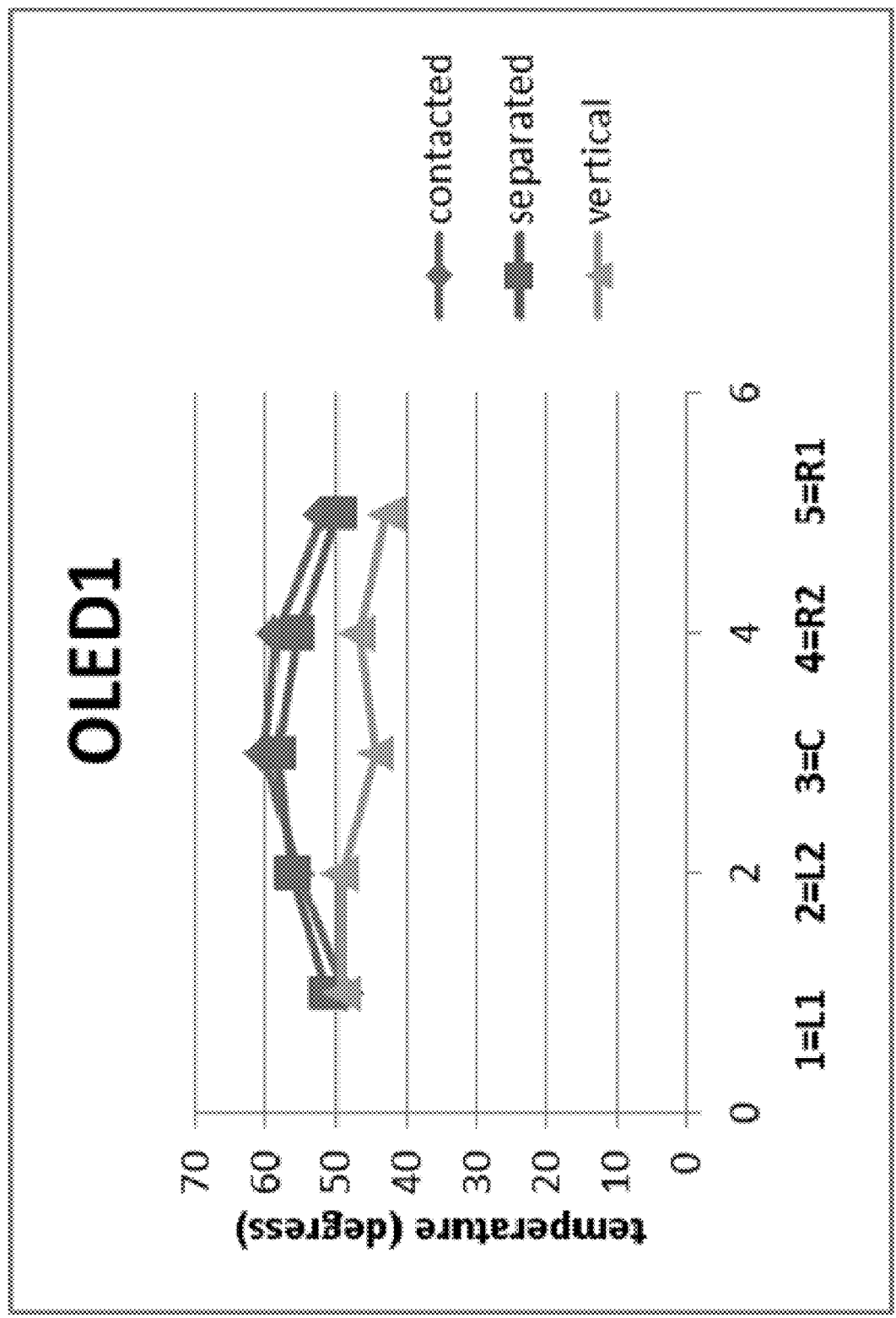
Figure 18:
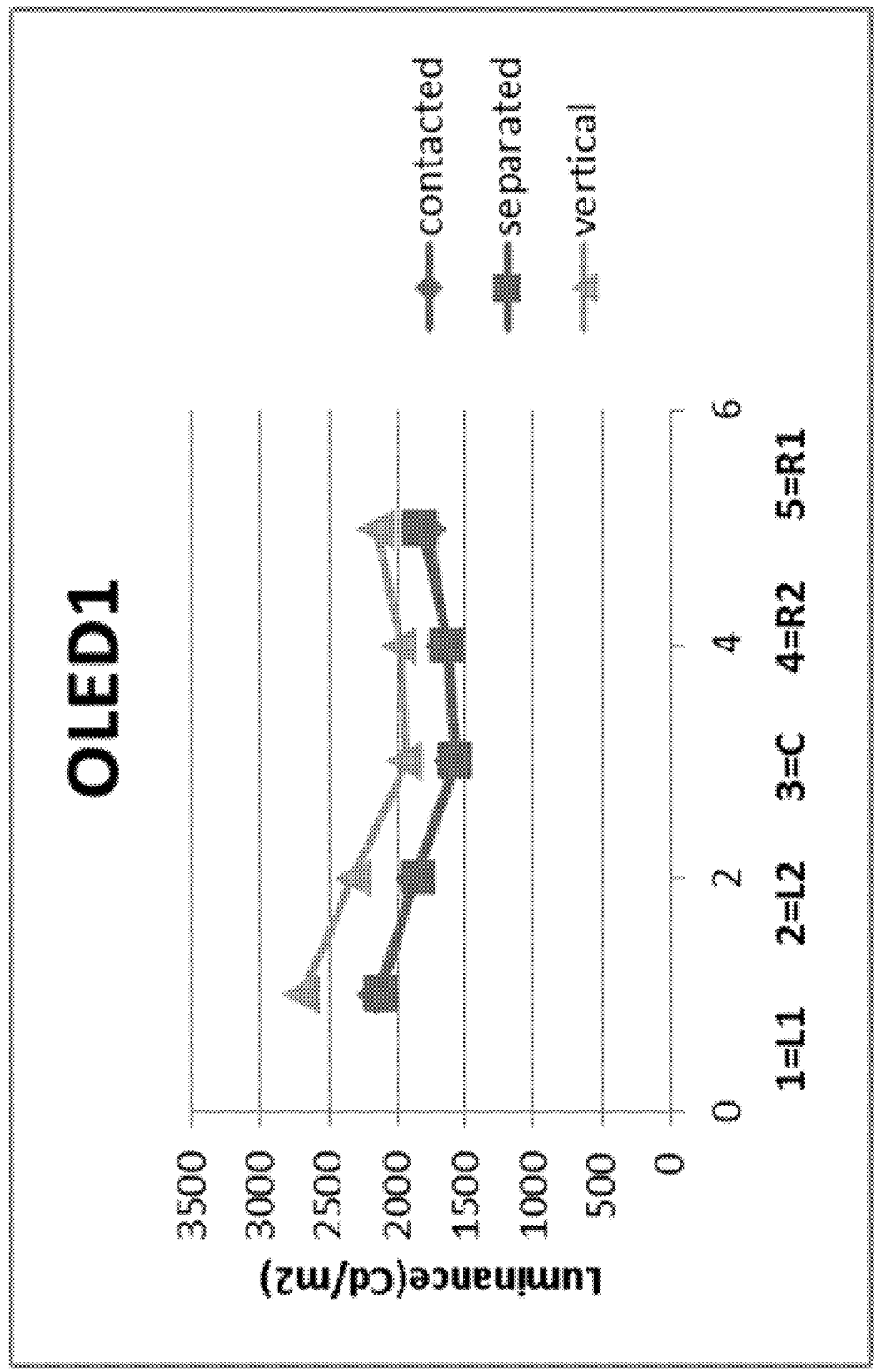

FIG. 6 is a block diagram of sampling points on tested OLED devices in accordance with an embodiment described herein. For example, the OLED devices can be such as OLED device 100 of FIG. 1. FIGS. 7-10 are graphs of luminance and temperature performance for OLED device samples operated in a horizontal orientation in accordance with an embodiment described herein. FIGS. 11-14 are graphs of luminance and temperature performance for OLED device samples operated in a vertical orientation in accordance with an embodiment described herein.

Figure 35:
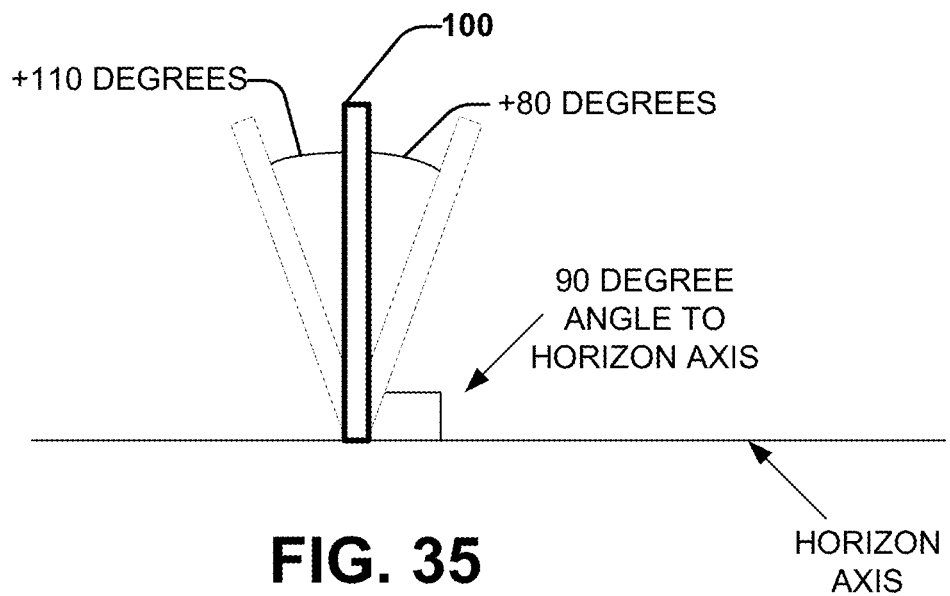
FIGS. 35 and 36 are example diagrams of OLED devices that are vertically oriented and horizontally oriented, respectively, in accordance with an embodiment described herein.
Figure 36:
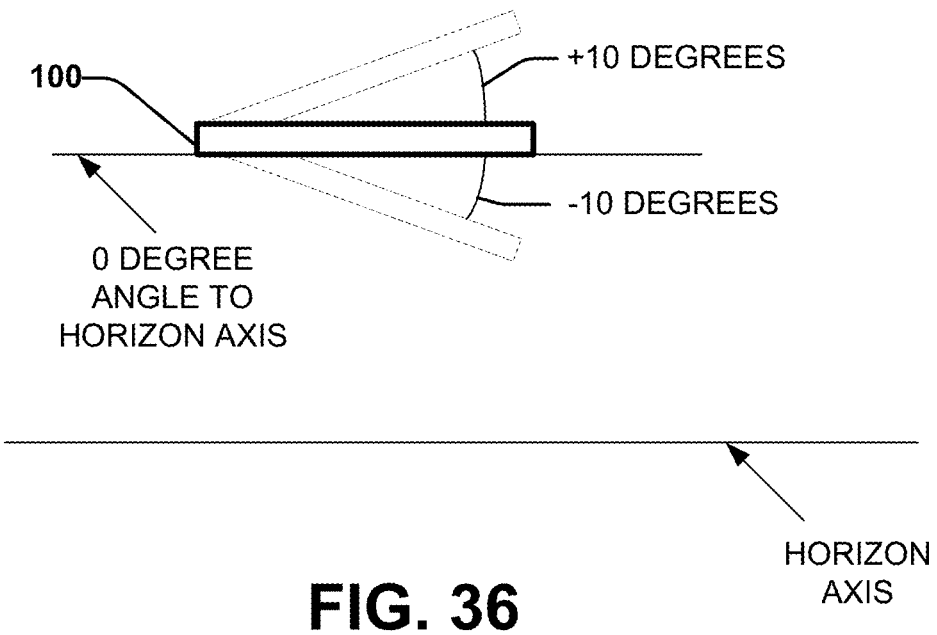

As used herein, the term "vertical orientation" shall include all substantially vertical orientations of OLED devices having display surfaces that are at an approximately 80 to 110 degrees angle to a 0 degree axis (where the 0 degree axis is the Earth's horizon). FIG. 35 is an example diagram of an OLED device that is vertically oriented. As used herein, the term "horizontal orientation" shall include all substantially horizontal orientations of OLED devices having display surfaces that are at an approximately 10 to −10 degree angle to a 0 degree axis (where the 0 degree axis is the Earth's horizon). FIG. 36 is an example diagram of an OLED device that is horizontally oriented. As a further example, "vertical orientation" can be the position in which the OLED device is hung from a vertical wall while the "horizontal orientation" can be the position in which the OLED device is connected on the ceiling or on a floor as a light carpet.

Turning to FIGS. 6-14, the experimental measurements associated with FIGS. 7-14 have been carried out in the OLED device sample positions of FIG. 6. The local temperature has been measured in nine different local points as shown in FIG. 6, where T represents "top," B represents "bottom," L represents "left," R represents "right" and C represents "center." At each sampling point of the OLED device, the local temperature and local luminance output was measured. The measurement was carried out from the time when the power was supplied to the OLED device until the time t=3000 seconds. The temperature was recorded every second and the luminance output was recorded every 10 seconds. The tested OLED device samples have three operating positions: vertically oriented, horizontally oriented without air convection under the panel of OLED device 100 and horizontally oriented with air convection under the panel. All samples only used natural air convection as the cooling method. The testing results are as shown in FIGS. 7-14.

As shown in FIGS. 7-10, when the panel of OLED device 100 is oriented horizontally with or without air convection under the back of the panel, in various embodiments, the center location has the highest temperature. However, as shown in FIGS. 11-14, when the panel is oriented vertically, the temperature distribution will be different. At this position, the top side of the panel has the highest temperature since the natural convection results in the heated air goes up. Therefore, the temperature at the center will not be the highest when the panel is oriented vertically. However, one can observe that both the highest and the lowest temperature in the vertical cases (e.g., FIGS. 11-14) are lower than the temperature in the horizontal cases (FIGS. 7-10). It may be caused by the desirable natural cooling condition in vertical case. The consequence of a lower operating temperature is the higher luminance output, which can be observed from FIGS. 11-14.

A detailed comparison is shown in FIGS. 15-18. FIGS. 15-18 are graphs of luminance and temperature performance when the OLED device has different operating orientations in accordance with an embodiment described herein. The curves in FIGS. 15-18 show that, by comparing with the horizontally operated OLED devices, both the maximum and the minimum luminance output increase at least 30 percent when the OLED device is operated vertically under the steady operating state. The reason may be that the vertically operated OLED device has better air convection. Thus, the surface temperature of the OLED device tends to be lower when the OLED device is operated/oriented vertically. From this point, the conclusion can be made that, in some embodiments, an OLED device should have a proper cooling system to improve the OLED device towards having the highest output efficiency.

In some embodiments, the luminance uniformity when the OLED device is operated in different orientations/positions can be analyzed. The uniformity of luminance is a quality issue that addresses how evenly light spreads over a particular area. In some embodiments, the uniformity, u, can be defined as the ratio of the difference between the maximal luminance ($lum_{max}$) and the minimal luminance ($lum_{min}$) over the area weighted average luminance ($lum_{average}$), and is shown in Equation 2:

$$u = (lum_{max} - lum_{min})/lum_{average} \qquad (2)$$

A smaller uniformity ratio will give better luminance uniformity on the surface of OLED devices. According to the definition elucidated in Equation 2, the uniformity of the OLED device can be compared when the OLED device is operated in different operating positions. OLED 1 and OLED 2 are two sample OLED devices.

The results of uniformity ratio measured for OLED 1 and OLED 2 device samples are shown in Table 1 and Table 2, respectively, where L represents "left," R represents "right," T represents "top" and B represents "bottom."

TABLE 1

|  | L to R | T to B |
| --- | --- | --- |
| Vertically operated | 34.4% | 48% |
| Horizontally operated without air convection | 31.1% | 31.6% |
| Horizontally operated with air convection | 30.3% | 29.8% |

TABLE 2

|  | L to R | T to B |
| --- | --- | --- |
| Vertically operated | 29% | 44% |
| Horizontally operated without air convection | 26.6% | 28.8% |
| Horizontally operated with air convection | 40.6% | 30.3% |

Generally speaking, as shown in Tables 1 and 2, when the OLED device is operated while in a vertical orientation, the uniformity of luminance is worse than when the OLED device is operated while in a horizontal orientation. The main reason may be caused by the shape of the temperature distribution, which is not the shape of "Λ" when the OLED device is operated vertically.

One or more embodiments of methods of improving the luminance uniformity of an OLED device follow. The embodiments of the methods are discussed with reference to FIGS. 11-14, 19-26 and Tables 3-6. FIGS. 19-26 show comparative results for OLED devices driven by different power levels and with different cooling devices.

Figure 19:
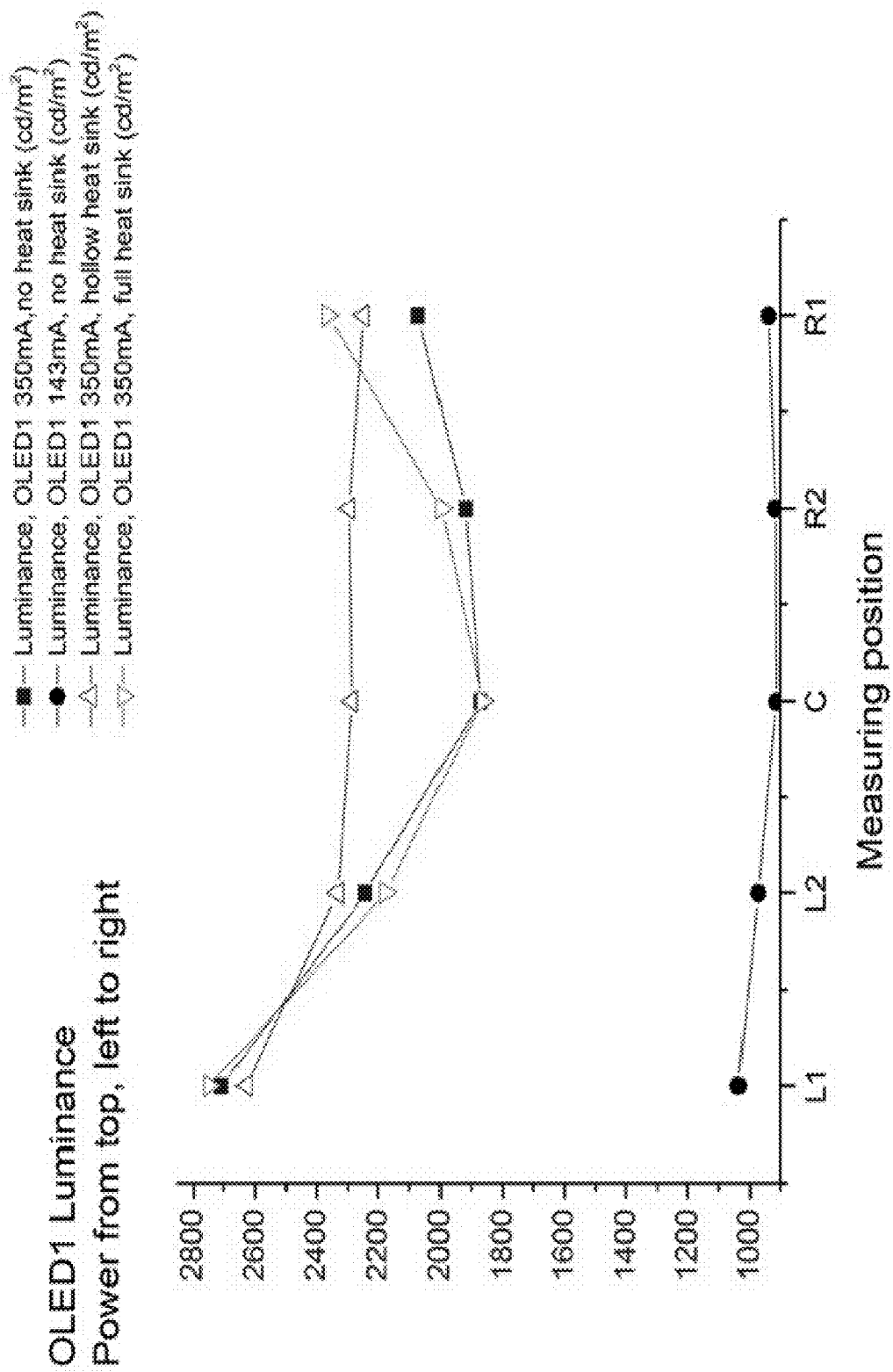
FIGS. 19 and 20 are example graphs of luminance distribution on the OLED device (from top to bottom) when the input power is supplied from the top of the OLED device in accordance with an embodiment described herein.
Figure 20:
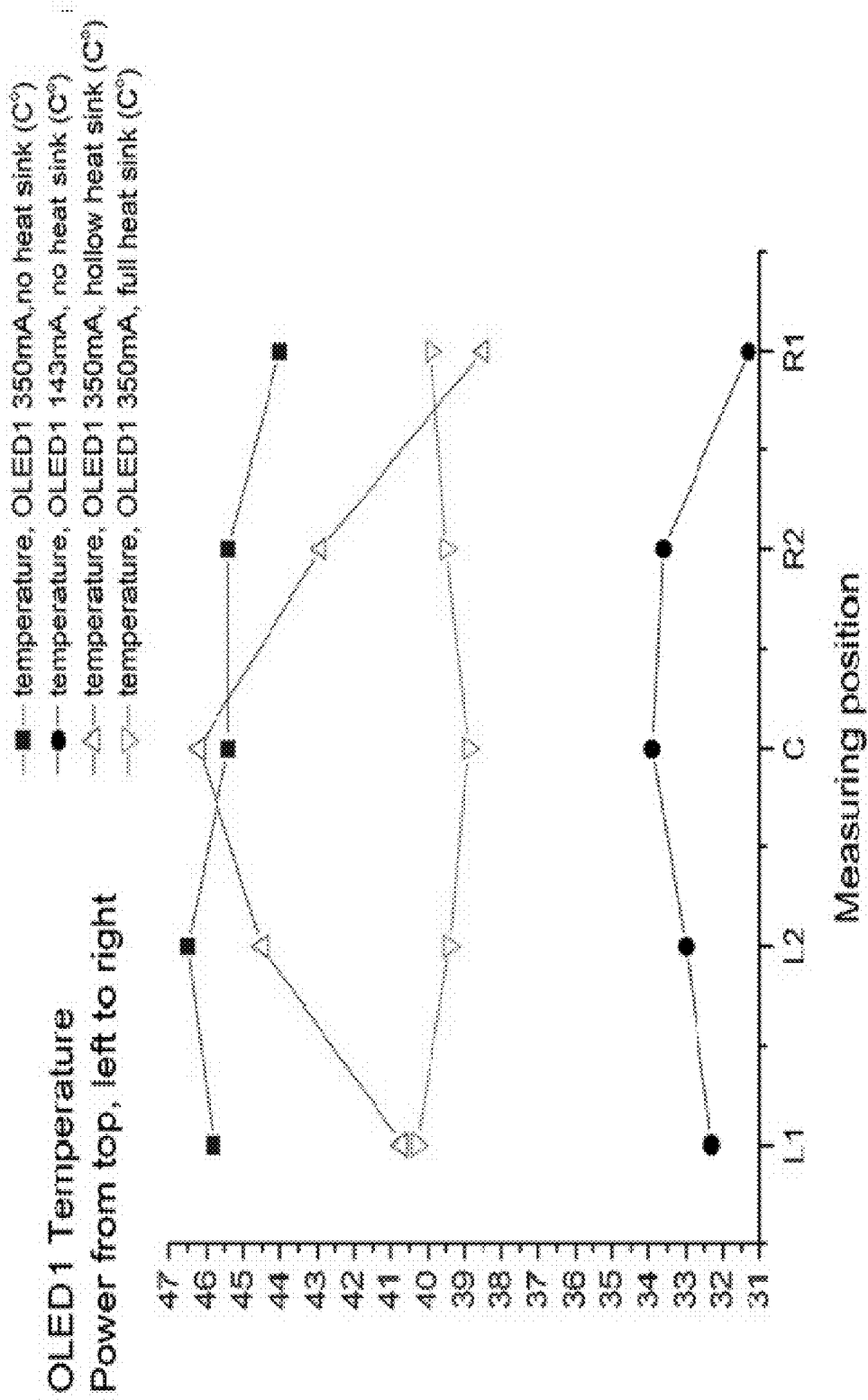
Figure 21:
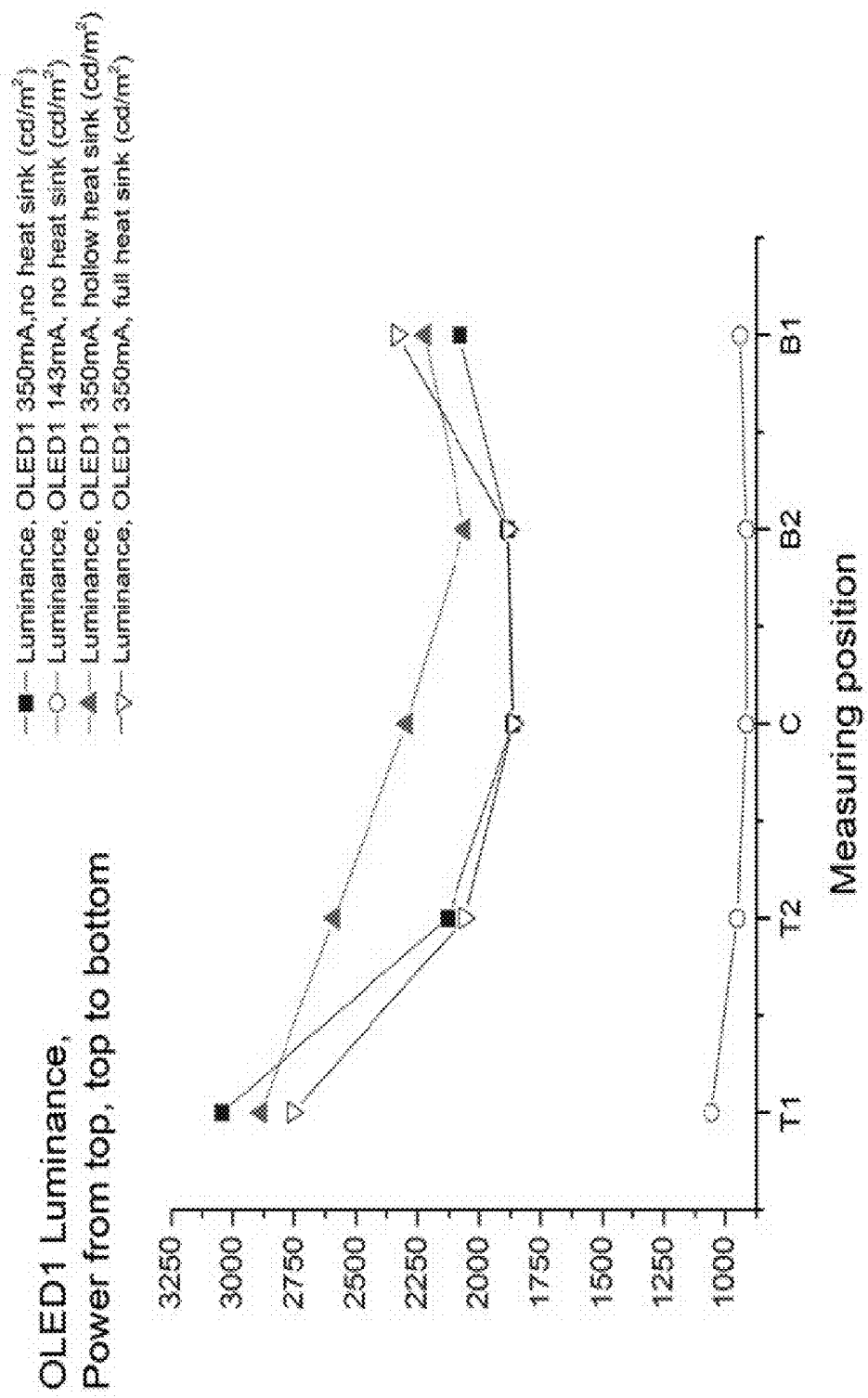
FIGS. 21 and 22 are example graphs of luminance distribution on the OLED device (from left to right) when the input power is supplied from the top of the OLED device in accordance with an embodiment described herein.
Figure 22:
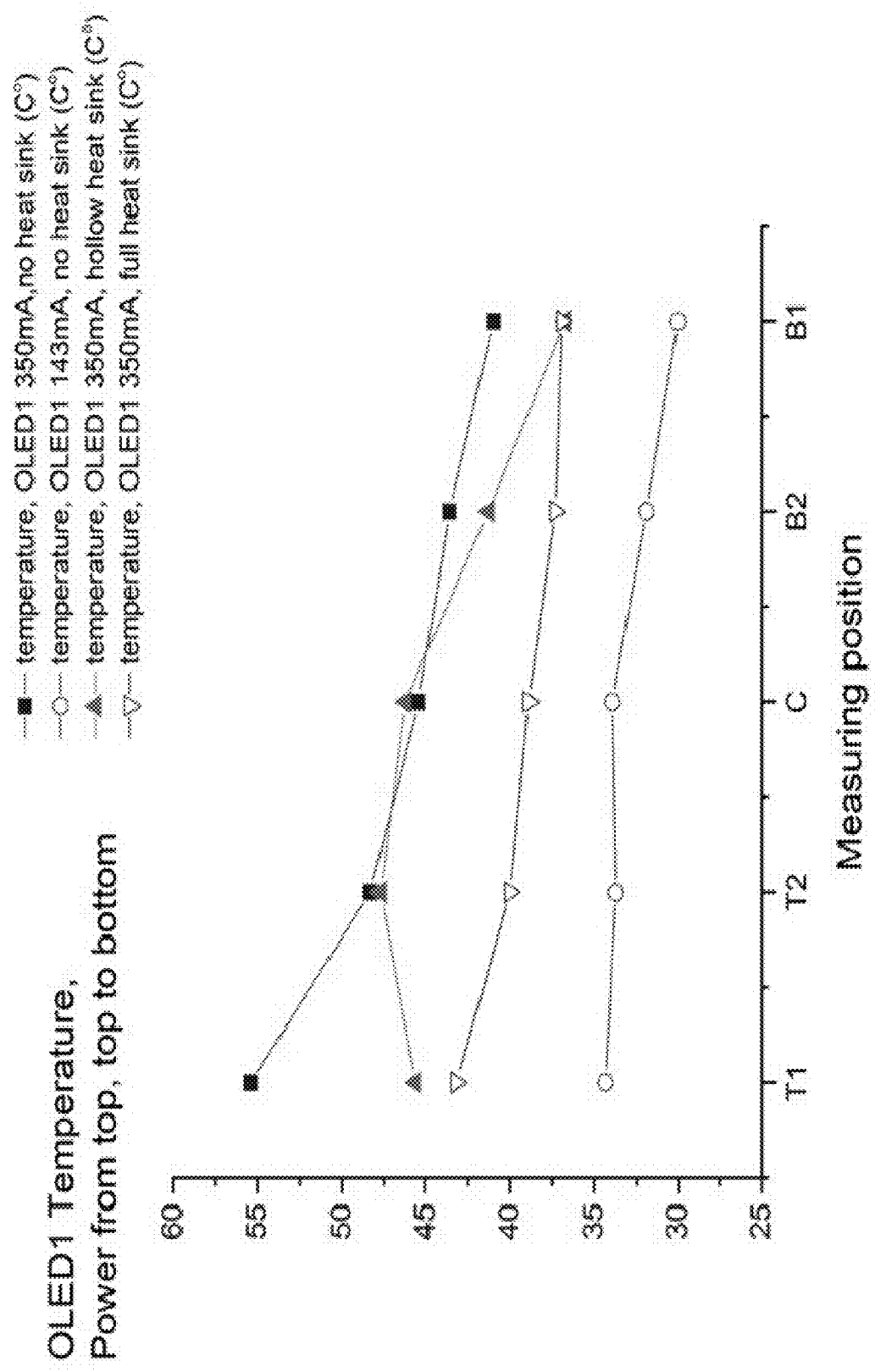
Figure 23:
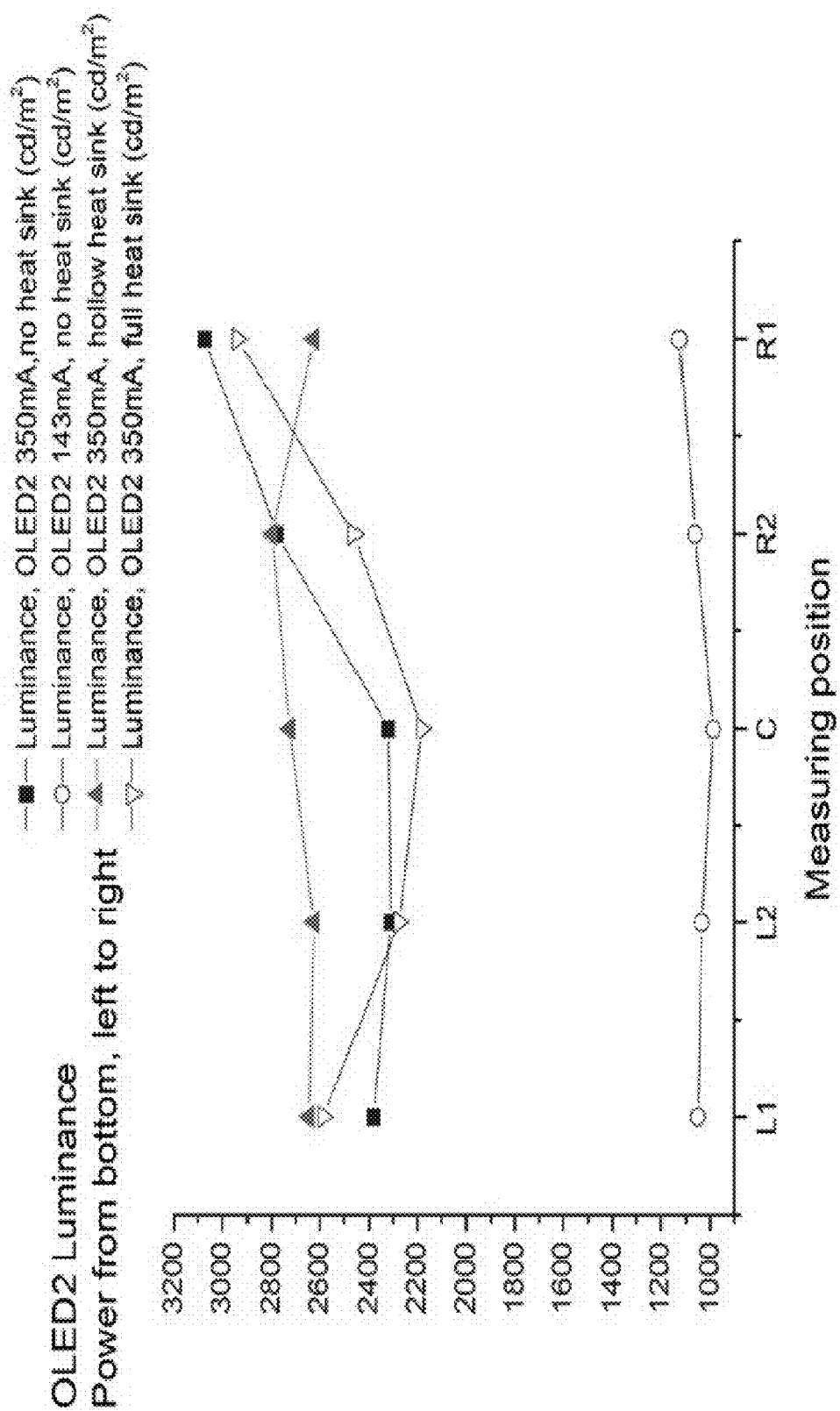
FIGS. 23 and 24 are example graphs of luminance distribution on the OLED device (from top to bottom) when the input power is supplied from the bottom of the OLED device in accordance with an embodiment described herein.
Figure 24:
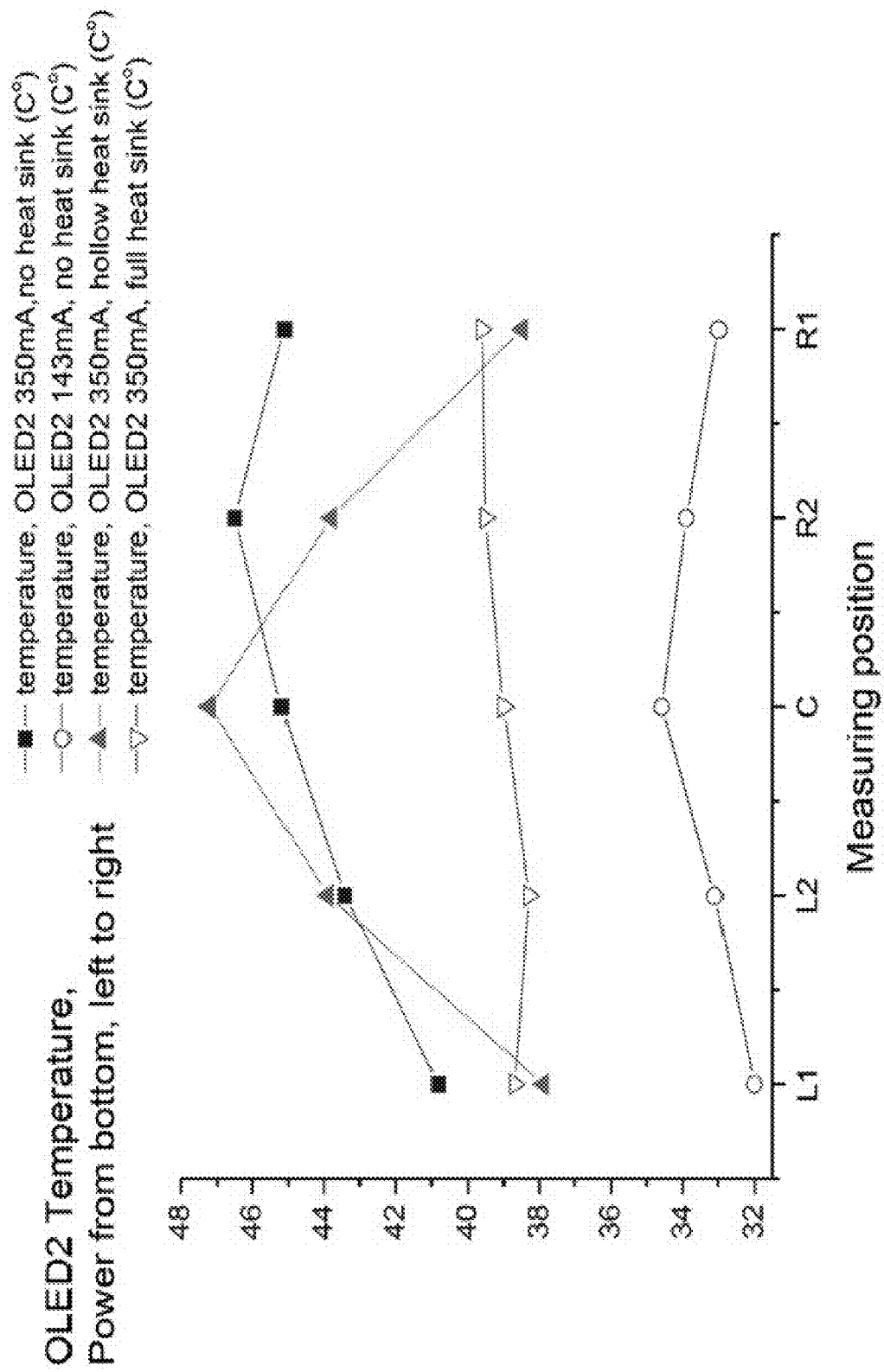
Figure 25:
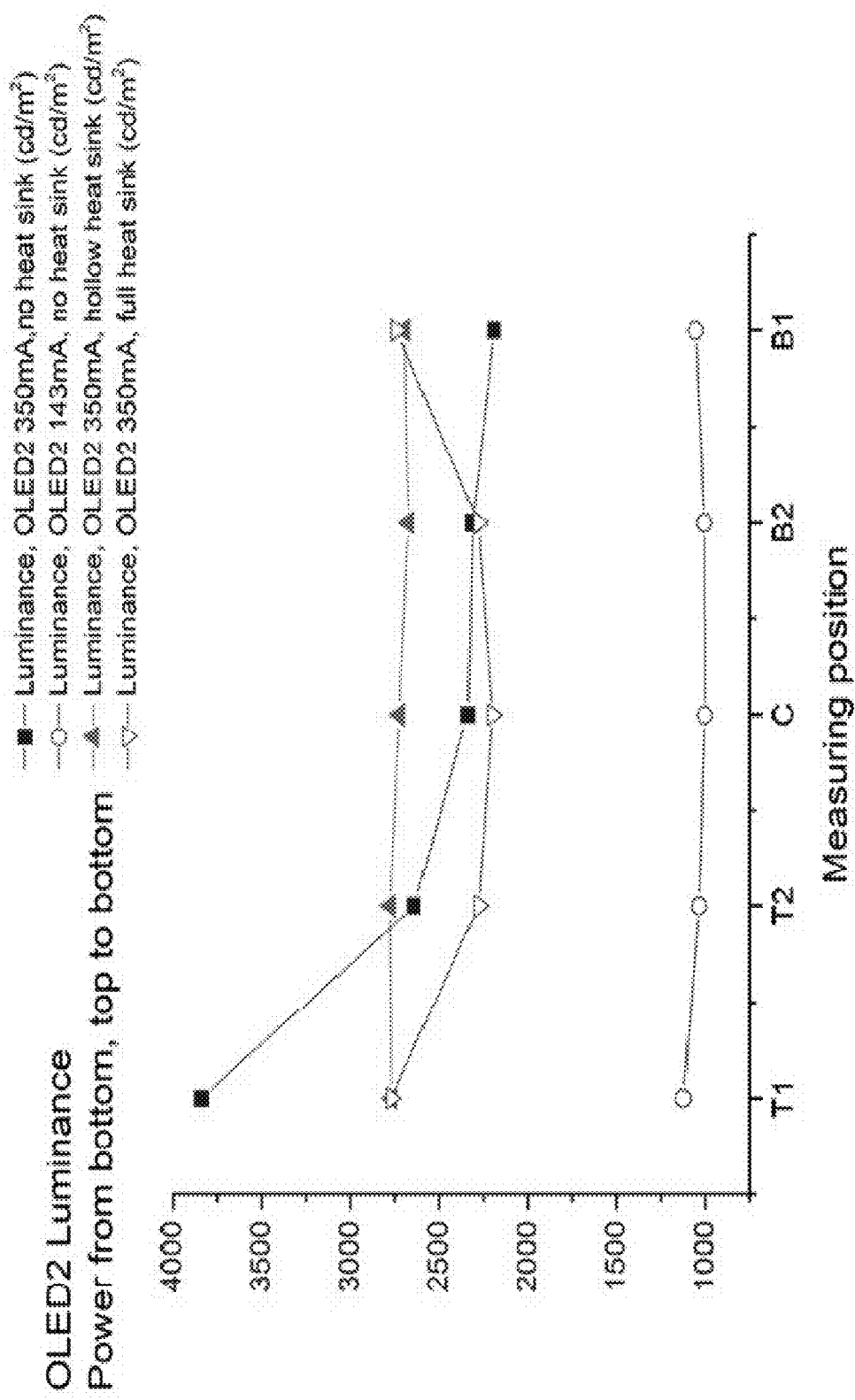
FIGS. 25 and 26 are example graphs of luminance distribution on the OLED device (from left to right) when the input power is supplied from the bottom of the OLED device in accordance with an embodiment described herein.
Figure 26:
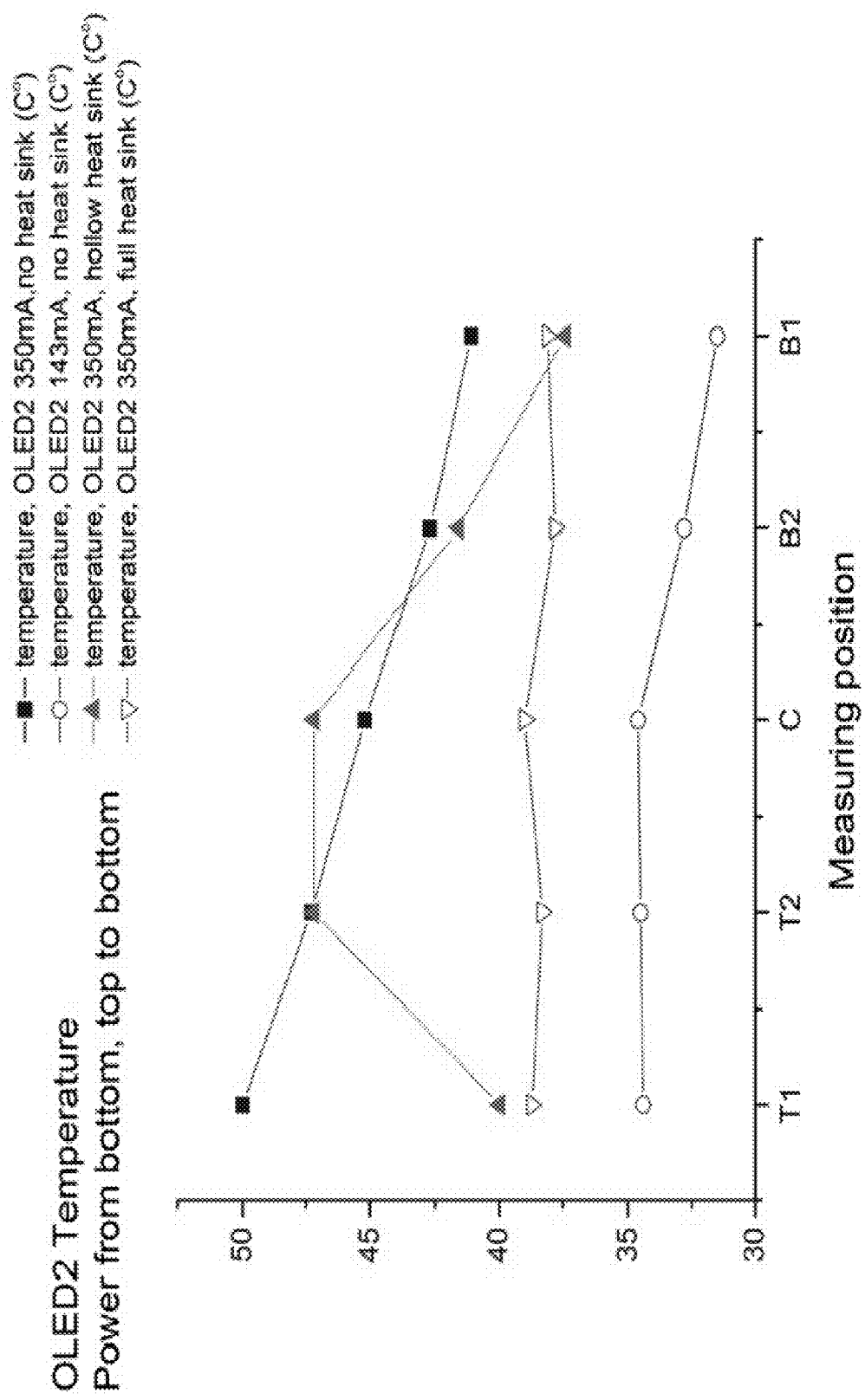
Figure 27:
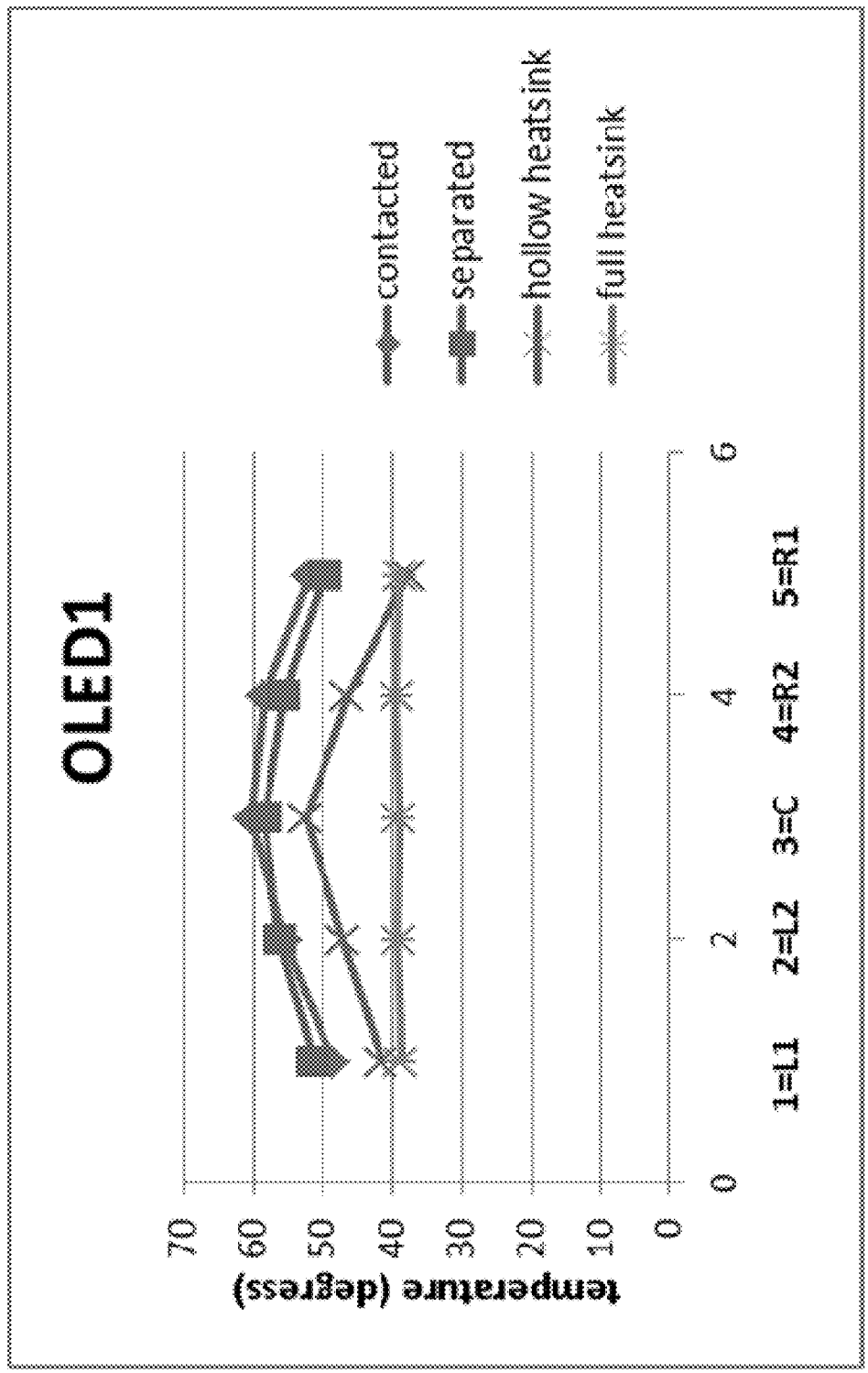
FIGS. 27, 28, 29 and 30 are example graphs of luminance and temperature performance when a first OLED device is operated in a horizontal orientation with and without heat sink in accordance with an embodiment described herein.
Figure 28:
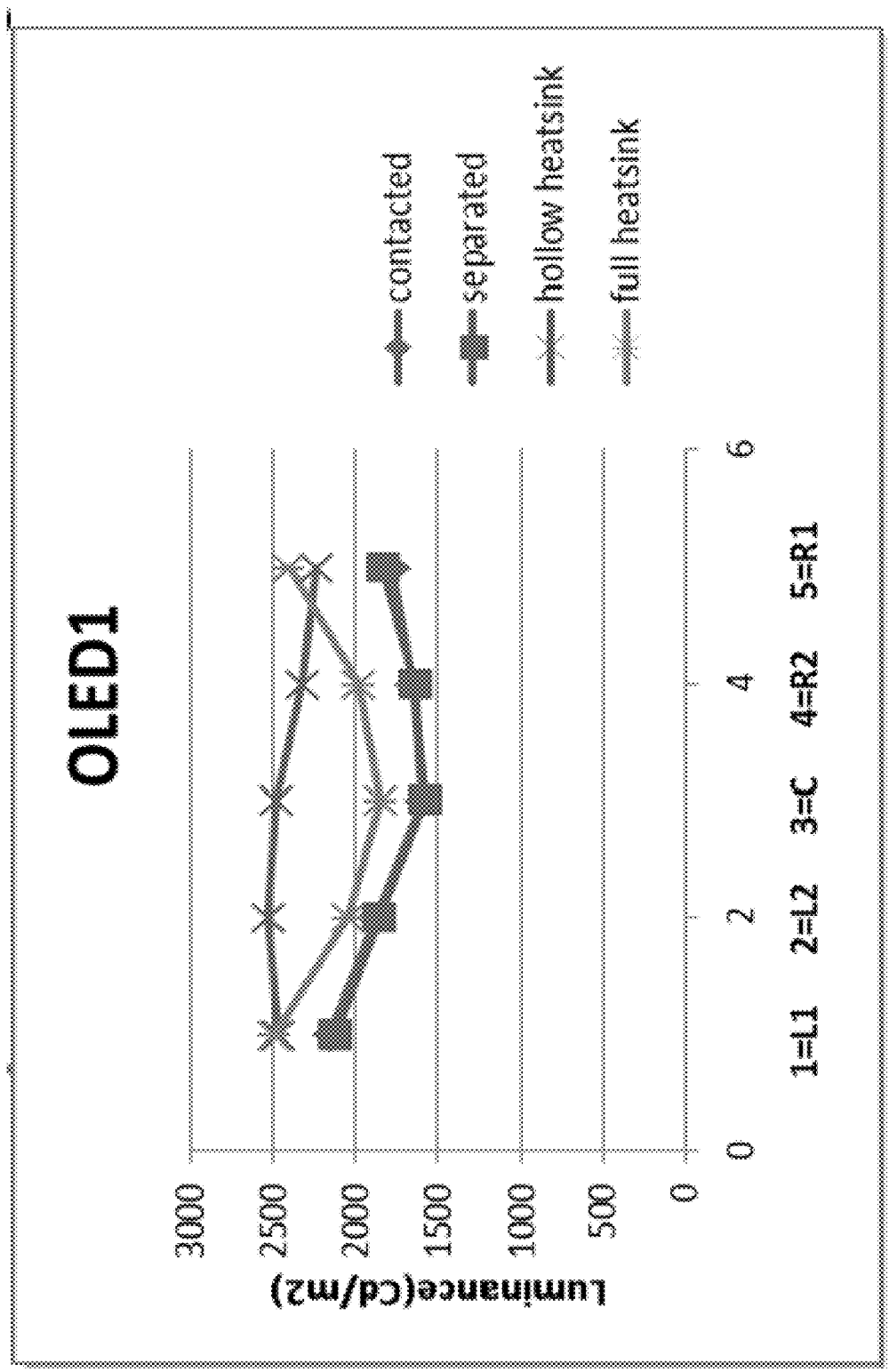
Figure 29:
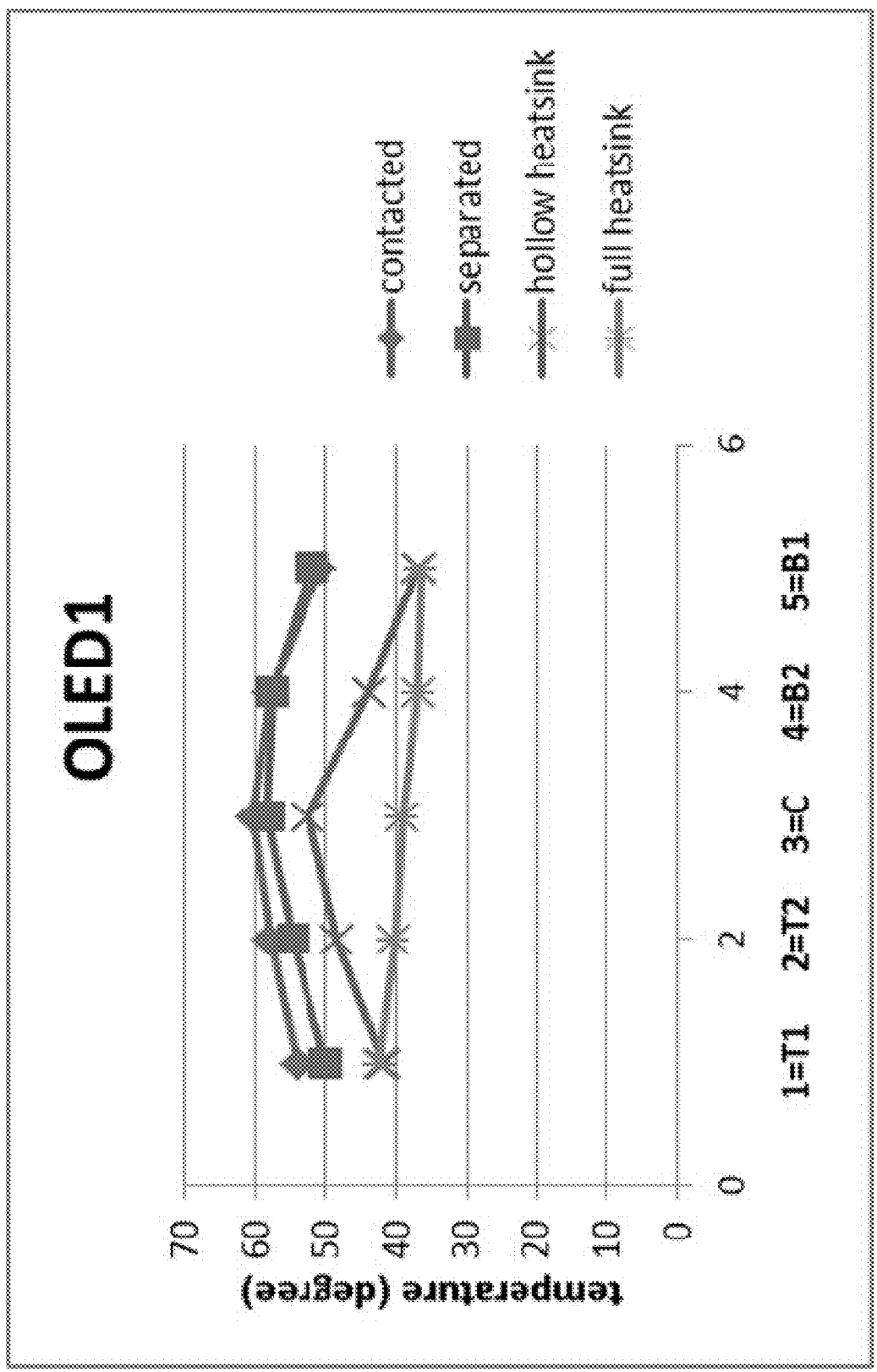
Figure 30:
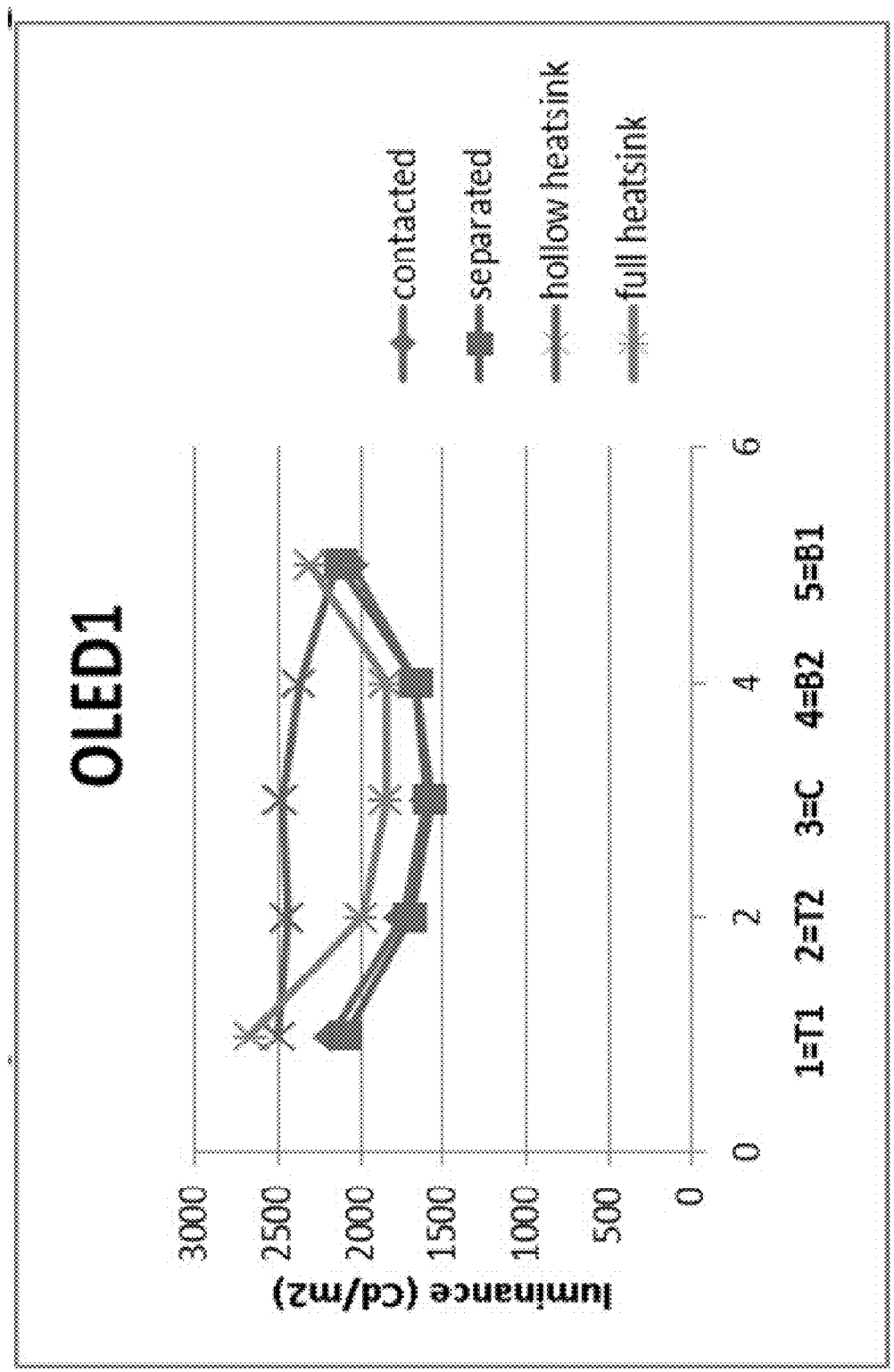
Figure 31:
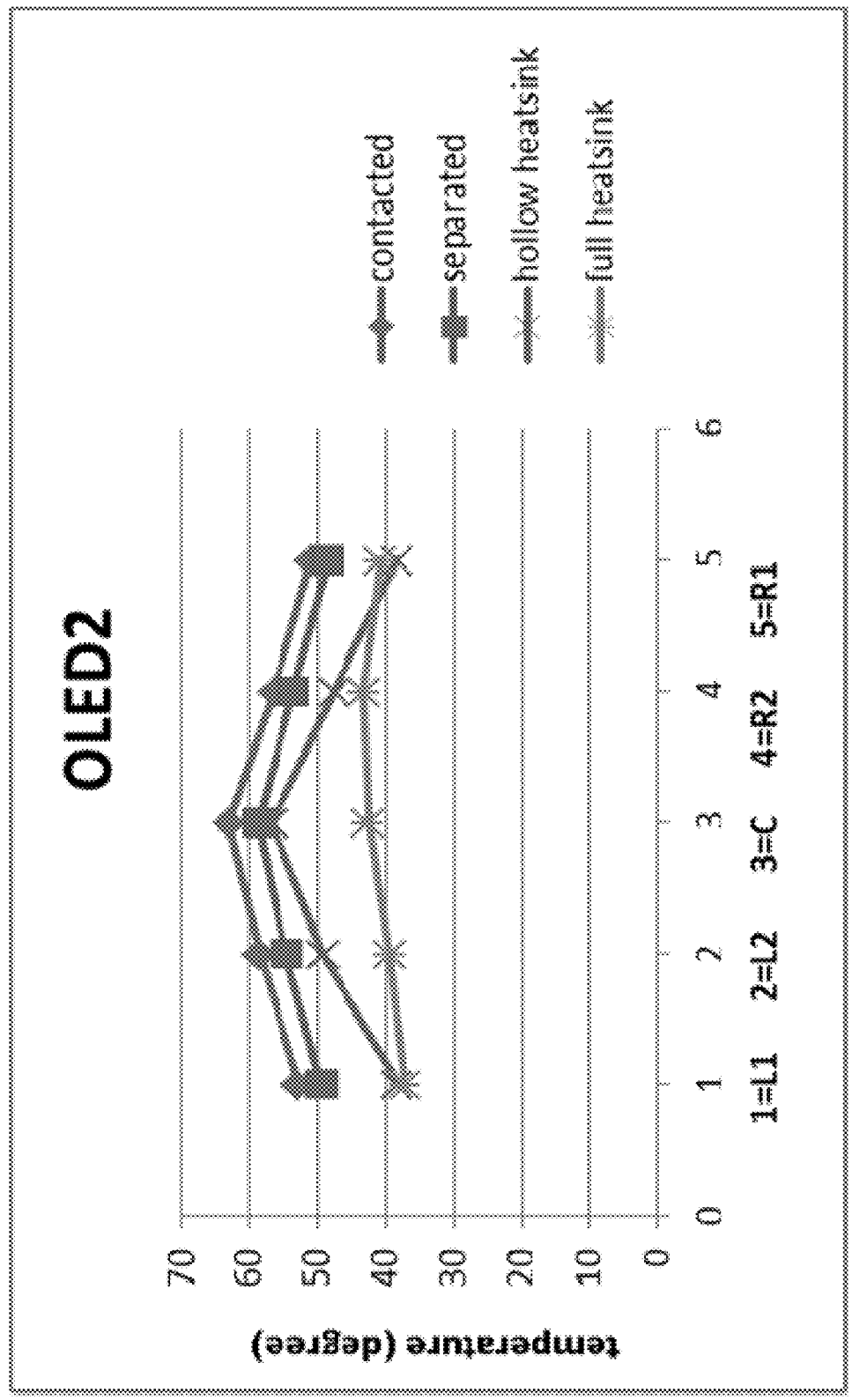
FIGS. 31, 32, 33 and 34 are example graphs of luminance and temperature performance when a second OLED device is operated in a horizontal orientation with and without heat sink in accordance with an embodiment described herein.
Figure 32:
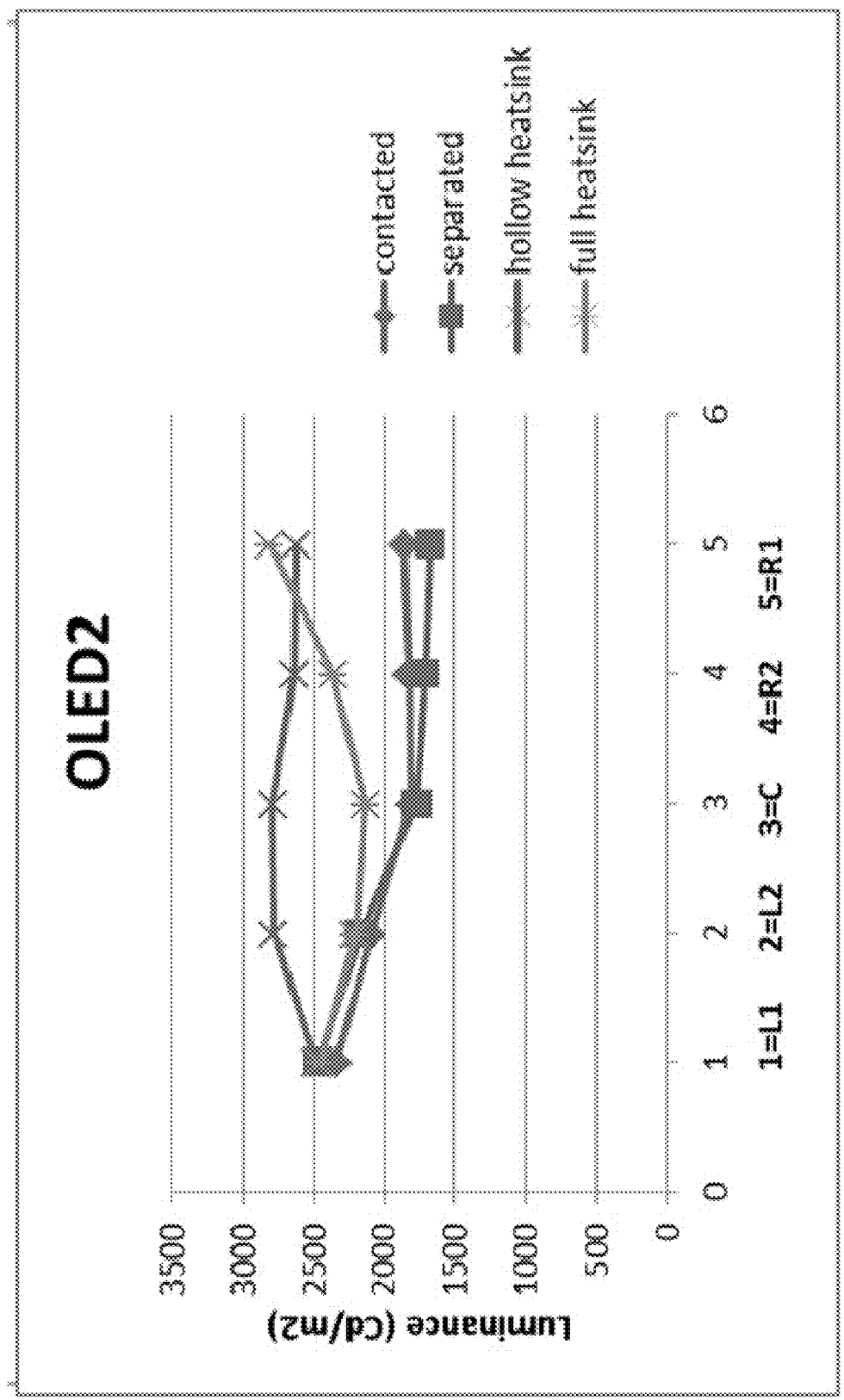
Figure 33:
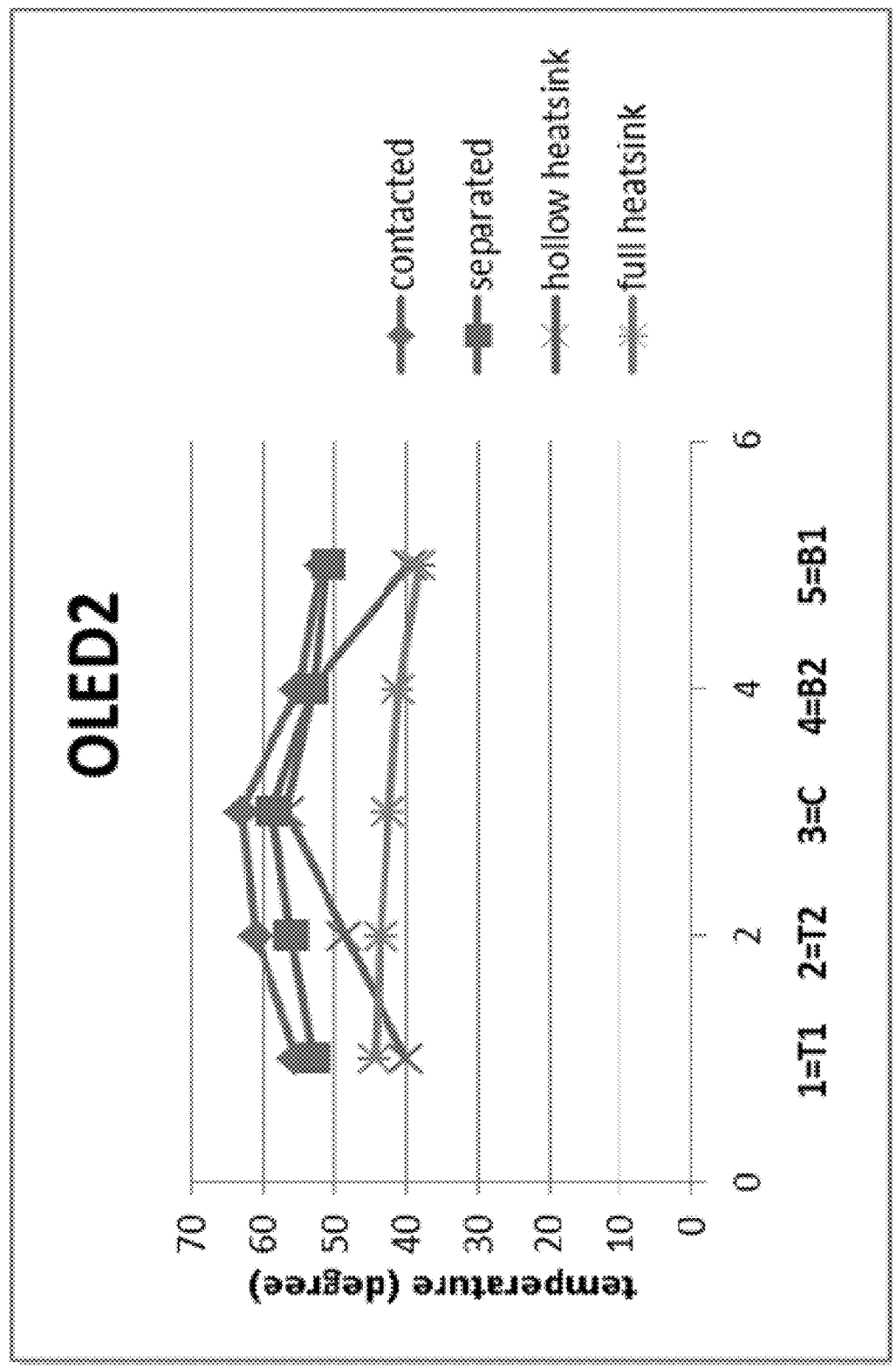
Figure 34:
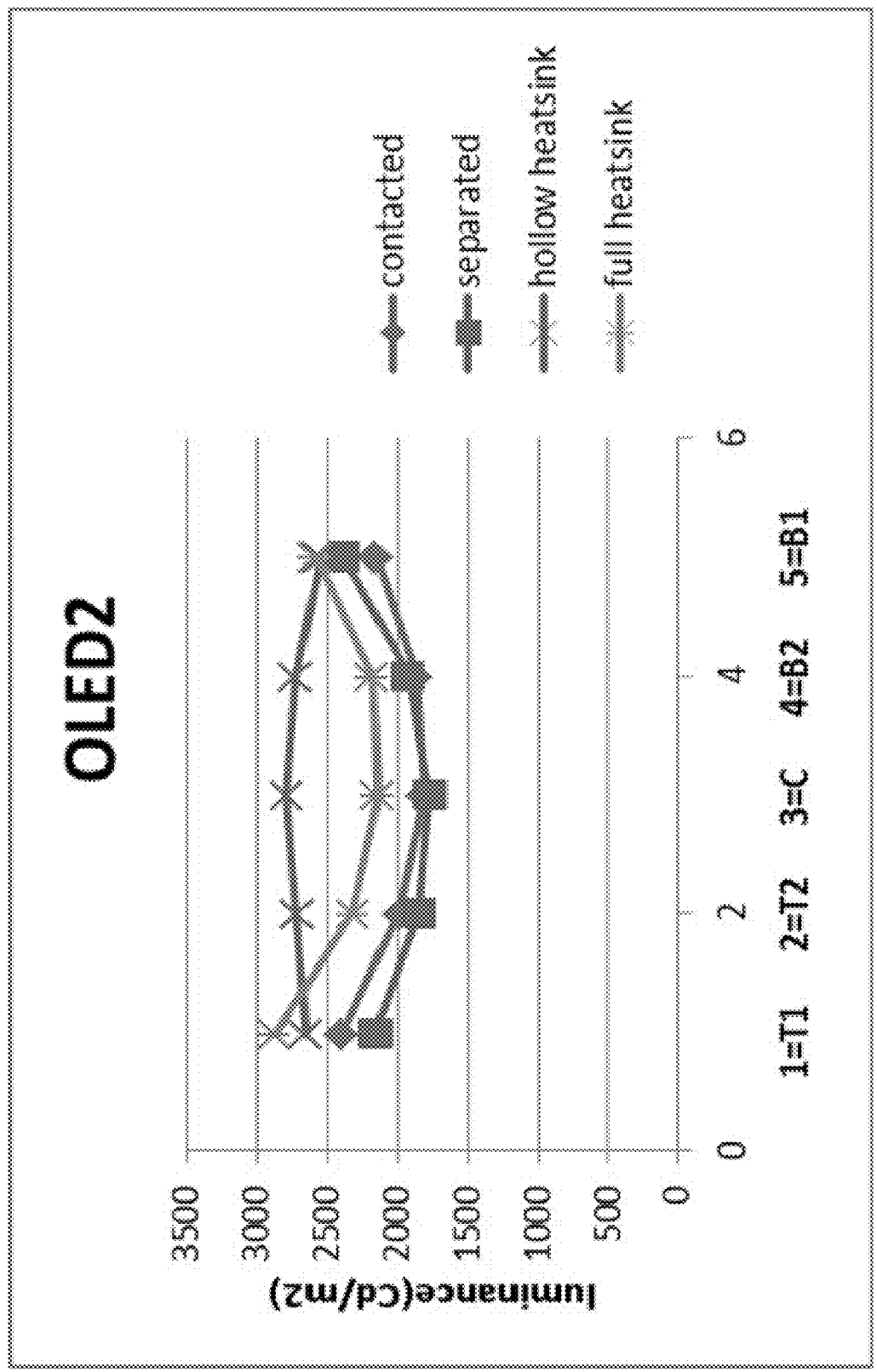

FIGS. 19 and 20 are graphs of luminance distribution on the OLED (from top to bottom) when the input power is supplied from the top of the OLED in accordance with an embodiment described herein. FIGS. 21 and 22 are graphs of luminance distribution on the OLED device (from left to right) when the input power is supplied from the top of the OLED device in accordance with an embodiment described herein. FIGS. 23 and 24 are graphs of luminance distribution on the OLED device (from top to bottom) when the input power is supplied from the bottom of the OLED device in accordance with an embodiment described herein. FIGS. 25 and 26 are graphs of luminance distribution on the OLED device (from left to right) when the input power is supplied from the bottom of the OLED device in accordance with an embodiment described herein.

In the following experimental investigation, one or more embodiments will show how to improve the uniformity of luminance when the OLED device is operated while in the vertical orientation. From the distributed resistance model of FIG. 2, there are at least two embodiments that result in an improvement in the luminance uniformity of the OLED device.

A first embodiment for improving the luminance uniformity when the OLED device is operated in the vertical orientation includes reducing the surface resistance value $r_1, \ldots, r_n$, (e.g., the resistance value of ITO material). A second embodiment for improving the luminance uniformity when the OLED device is operated in the vertical orientation includes increasing the volume resistance value $R_1, \ldots, R_n$ (e.g., the resistance value of the light emitting material). These two embodiments are related with the issue of OLED materials.

A third embodiment for improving the luminance uniformity when the OLED device is operated in the vertical orientation includes operating the OLED device under a power that is lower than the rated power of the OLED device. In the low power case, the resistance value in organic semiconductor 106 is much larger than the resistance value under full power. However, the improved luminance uniformity tends to sacrifice the lumen output efficiency.

Besides these three embodiments, a fourth embodiment for improving luminance uniformity can be as follows. The existence of the surface resistance in the ITO material can cause the voltage drop from the periphery/edge to the center of the OLED device (e.g., cross-section A-A 108) to have a shape of "V" (or, in some embodiments, approximately "V"). To make sure the current distribution in each section has almost the same value, in some embodiments, the resistance value in organic semiconductor 106 is also designed to have substantially the distribution shape of "V." Accordingly, the resistance value can be designed to be smallest in the center of the OLED device and largest in the periphery area of the OLED device. Since the resistance value is inverse proportional to the material temperature, from this point, one can find out the solution for the problem: try to keep a relatively lower temperature at the periphery area of the OLED device so that we can obtain a relatively higher resistance value in the periphery area of the OLED device. Therefore, in some embodiments, a hollow heat sink can be designed and attached to the cathode of the OLED device (e.g., with reference to FIG. 41 the hollow heat sink can be attached to cathode 104 of OLED device 100).

In various embodiments, the heat sink can be any type of device that can transfer thermal energy from a higher temperature device to a lower temperature fluid medium. The fluid medium is frequently air, but in other embodiments, can also be water, refrigerants or oil.

Figure 41:
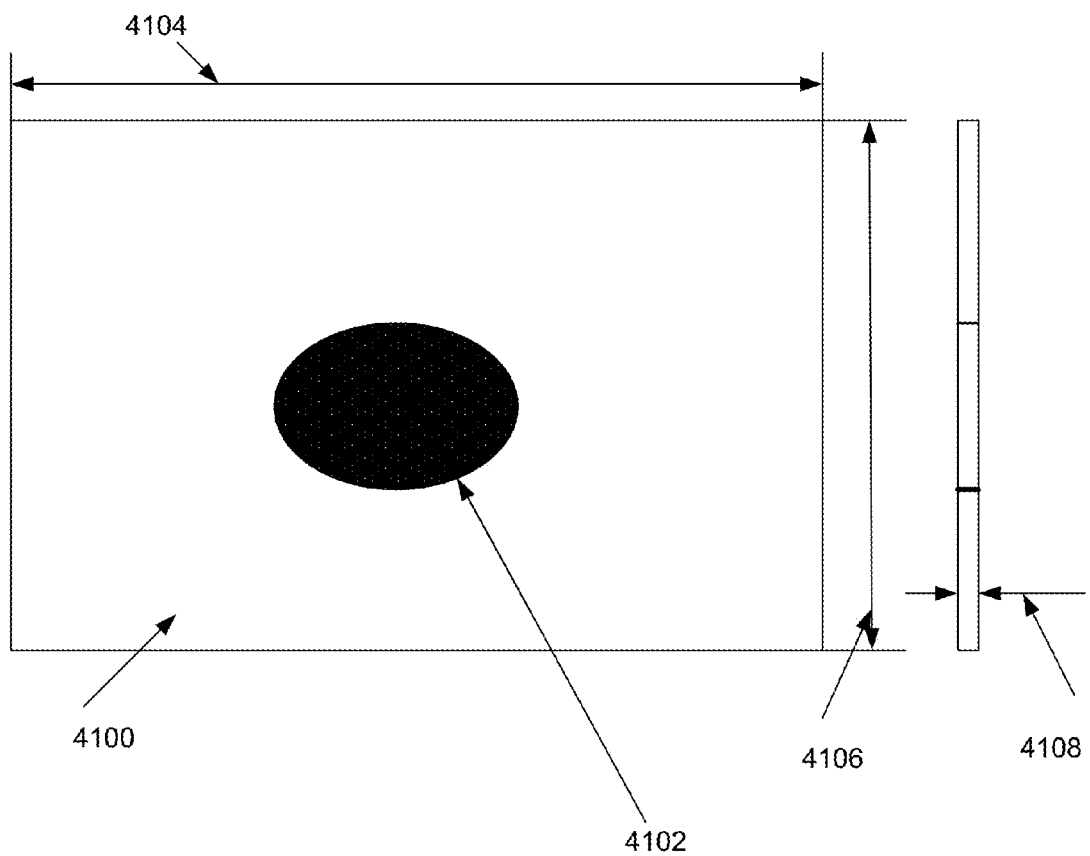
FIG. 41 is an example diagram illustrating example size and dimension of a hollow heat sink in accordance with an embodiment described herein.

The material of the heat sink can be aluminum, copper or tungsten. Aluminum is the most common material typically used for heat sinks, followed by copper (which is 4-6 times more expensive than aluminum and 3 times as heavy as aluminum, but has 2 times the conductivity of aluminum) or tungsten. An example heat sink as described herein can be as shown in FIG. 41.

The heat sink can be attached to the cathode by any kind of mechanism. However, in some embodiments, to facilitate thermal transfer, the pressure between heat sink and heat source must be high. The heat sink attachment is permanent in various embodiments. Heat sink clips can be designed to provide strong pressure while still being reasonably easy to install. Heat sink mountings with screws/springs are often better than regular clips. Thermoconductive glue or sticky tape can be employed in embodiments in which mounting with clips or screws is not possible or in embodiments in which the heat sink is attached temporarily to the panel, or OLED device.

The hollow heat sink can be a fin type, a pin type or any other type, and can be designed in these different types based on the thermal condition of the OLED device. In some embodiments, the heat sink can be designed to maximize the surface area of the heat sink in contact with the cooling medium surrounding the heat sink.

Figure 42:
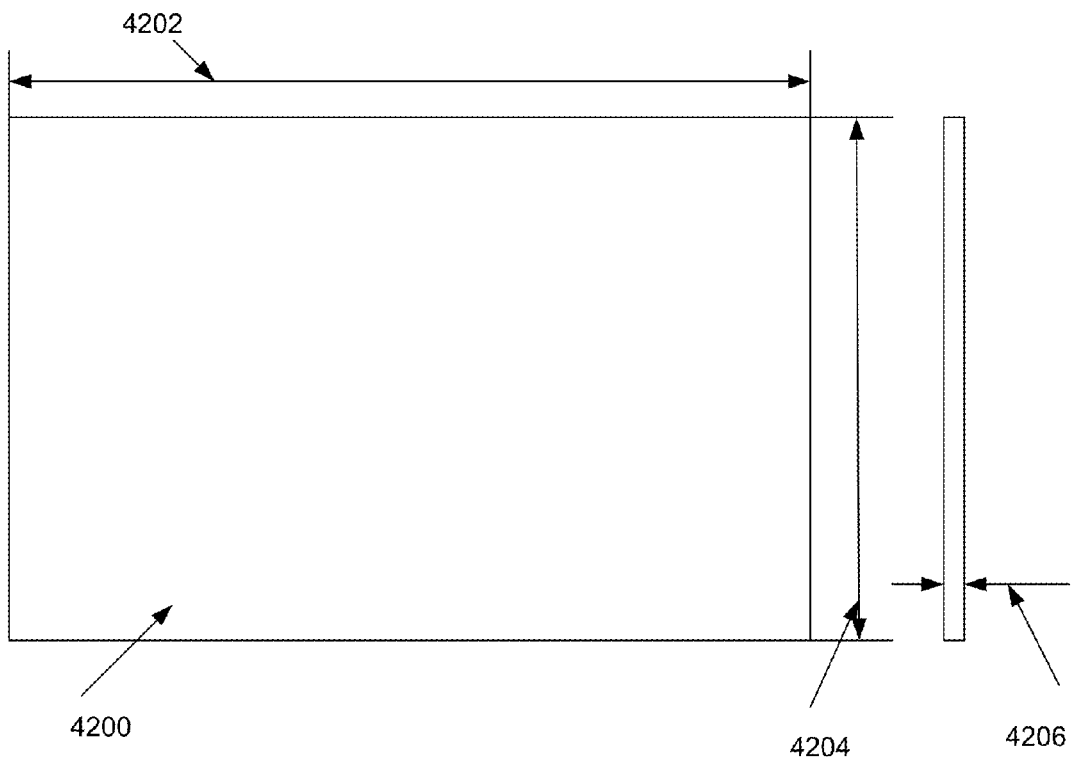
FIG. 42 is an example diagram illustrating example size and dimension of a full heat sink in accordance with an embodiment described herein.

FIG. 40 is another example diagram of an OLED device in accordance with an embodiment described herein. FIG. 41 is an example diagram illustrating example size and dimension of a hollow heat sink in accordance with an embodiment described herein. FIG. 42 is an example diagram illustrating example size and dimension of a full heat sink in accordance with an embodiment described herein. The dimension of the OLED device, the hollow heat sink and the full heat sink used in the described embodiments can be as shown in FIGS. 40, 41 and 42.

Turning first to FIG. 40, an example size and dimension of OLED device is shown. Non-shaded region 4000 can be the light emitting area of OLED device 100 while shaded region 4002 can be the power supply region. The power supply region can be a non-light emitting area of OLED device 100. As also shown, the diameter 4006 of non-shaded region 4000 can be approximately 75 millimeters (mm) while diameter 4008 of OLED device 100, including shaded region 4002 (e.g., including power supply region) can be approximately 85 mm. The sizes and dimensions are mere examples and other sizes can be employed in various other embodiments.

Turning now to FIG. 41, shown, is an example diagram illustrating example size and dimension of a hollow heat sink in accordance with an embodiment described herein. As shown in FIG. 41, hollow heat sink 4100 can have hollow region 4102 that has a diameter of approximately 40 mm. The length 4104 of hollow heat sink 4100 can be approximately 109 mm, the height 4106 of hollow heat sink 4100 can be approximately 102 mm and the width 4108 of hollow heat sink 4100 can be approximately 2 mm. The sizes and dimensions are mere examples and other sizes can be employed in various other embodiments.

Turning now to FIG. 42 is an example diagram illustrating example size and dimension of full heat sink 4200 in accordance with an embodiment described herein. The length 4202 of full heat sink 4200 can be approximately 109 mm, the height 4204 of full heat sink 4200 can be approximately 102 mm and the width 4206 of full heat sink 4200 can be approximately 2 mm. The sizes and dimensions are mere examples and other sizes can be employed in various other embodiments.

The dimension and the type of the hollow or full heat sinks are unlimited, which only depends on the thermal condition of the OLED device. The basic function of the heat sink here is to supply a suitable temperature condition to make sure the resistance value of the organic semiconductor has the same variation tendency as the voltage from the edge of the OLED device to the center of the device. Therefore, the heat sink may or may not have a hollow shape in various different embodiments.

In various embodiments in which the heat sink of the embodiments designed herein can be substantially shaped to provide a temperature profile/distribution on the panel, or OLED device and sized to span a surface of the means for emitting light from the first region. Therefore, the shape and the size of the heat sink can be any and depends only on the application.

Figure 44:
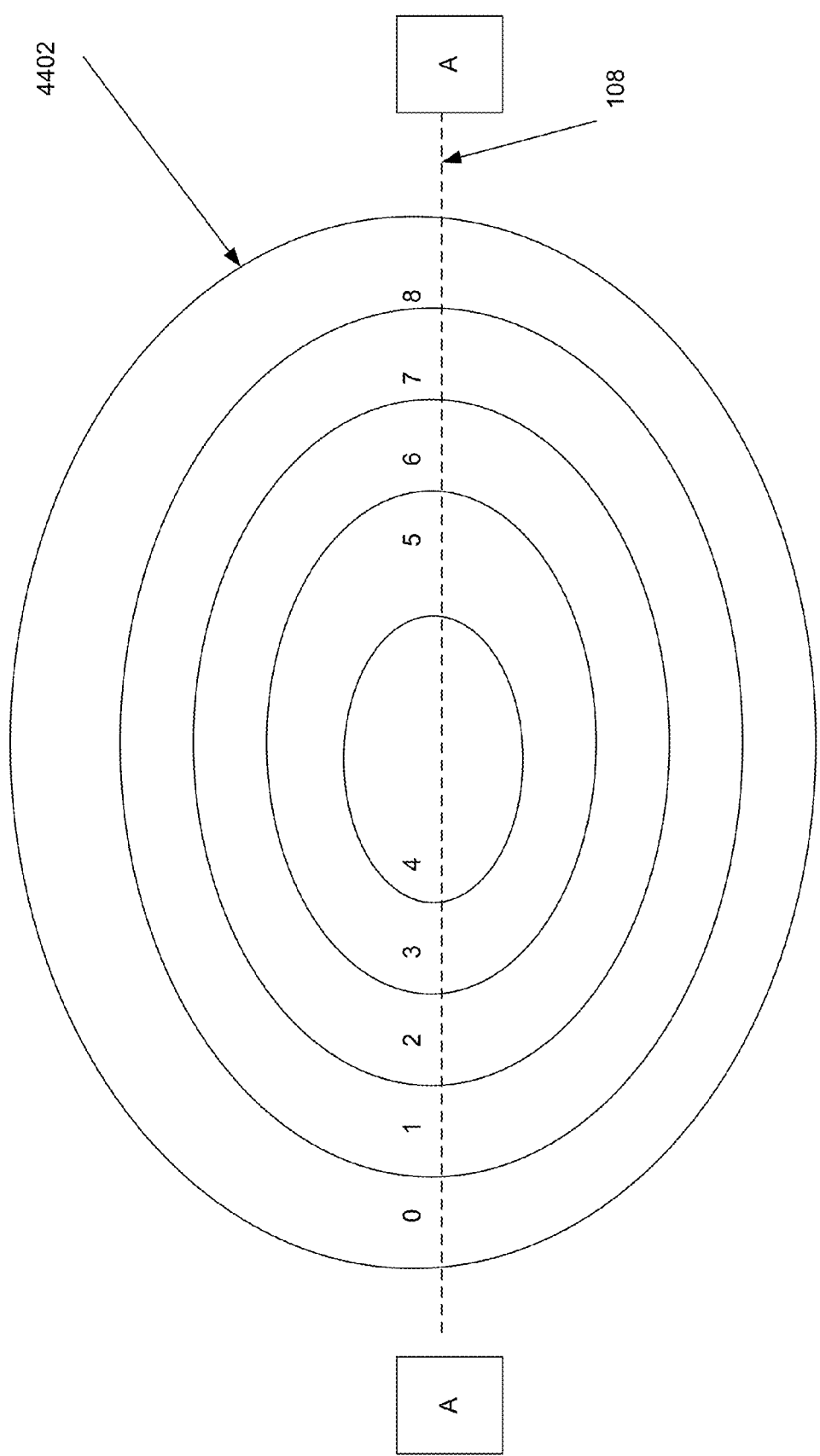
FIG. 44 is an example diagram illustrating simulation sampling sections on the surface of the OLED device of FIG. 40 in accordance with an embodiment described herein.

An example of the hollow heat sink can be as shown in FIG. 41. In the embodiment shown, a single hollow heat sink is employed over the entirety of the OLED device. FIG. 44 is an example diagram illustrating simulation sampling sections on the surface of the OLED device of FIG. 40 in accordance with an embodiment described herein. In FIG. 44, the entire OLED device 100 can be divided into five rings (represented by numbers 0, 1, 2, 3 and 4 in FIG. 44). Each of the rings can be considered a section of OLED device 100. As described above, the heat sink is employed to make sure the current distribution in each has almost the same value. Cross-section A-A 108 and edge 4402 of OLED device 100 are also shown.

Normally, the cathode of the OLED device is considered as a good conductor. The hollow heat sink can build up a pathway for the heat generated inside the light emitting material at the edge of the panel of the OLED device. The hollow heat sink attached to the light emitting material of the OLED device therefore results in a temperature distribution around the panel of the OLED device has the shape of "Λ" (or, in some embodiments, approximately "Λ"), and the current distribution can be therefore substantially uniform. As such, the luminance uniformity of OLED devices can be improved.

The experimental results shown in FIGS. 11-14 are the comparative results for OLED devices operated under full power with hollow heat sink, with full heat sink, without any heat sink and the OLED devices operated under half rated power without any heat sink. The OLED devices samples are operated while in a vertical orientation. The input power was supplied to the OLED devices either from the top side of the OLED devices or from the bottom side of the OLED devices.

As shown in FIGS. 11-14, the emitting light has the minimum output value but the most uniform light distribution when the OLED device is driven by half rated power. The reason for this result has been previously discussed herein. For the other three experimental curves operated under full power, as shown, the emitting light always has the best luminance uniformity when the cooling device is a hollow heat sink. Tables 3 and 4 list the data for comparison. Tables 3 and 4 show uniformity ratios measured for OLED 1 and OLED 2, respectively.

TABLE 3

| Cooling device | Power supplied from the top | | Power supplied from the bottom | |
|---|---|---|---|---|
| | Vertical direction | Horizontal direction | Vertical direction | Horizontal direction |
| No heat sink | 53% | 39% | 47% | 34% |
| Full heat sink | 41% | 40% | 39% | 43% |
| Hollow heat sink | 34% | 16% | 10% | 17% |
| Half rated power no heat sink | 15% | 13% | 11% | 13% |

TABLE 4

| Cooling device | Power supplied from the top | | Power supplied from the bottom | |
|---|---|---|---|---|
| | Vertical direction | Horizontal direction | Vertical direction | Horizontal direction |
| No heat sink | 48% | 27% | 62% | 30% |
| Full heat sink | 26% | 29% | 23% | 30% |
| Hollow heat sink | 16% | 19% | 4% | 6% |
| Half rated power no heat sink | 9% | 5% | 11% | 13% |

The same tests have been carried out when a hollow heat sink or a full heat sink was attached to the back of the OLED device sample while the panel was operated horizontally. In the embodiments shown and described herein, the OLED device sample is the same component as the panel. FIGS. 27, 28, 29 and 30 are graphs of luminance and temperature performance when a first OLED is operated in a horizontal orientation with and without heat sink in accordance with an embodiment described herein. FIGS. 31, 32, 33 and 34 are graphs of luminance and temperature performance when a second OLED device is operated in a horizontal orientation with and without heat sink in accordance with an embodiment described herein. As shown in FIGS. 27-34, the testing results are compared with the results when the OLED device that is operated in the horizontal orientation without any heat sink attached.

The uniformity ratio for both OLED 1 and OLED 2 devices are shown in Table 5 and 6. Table 5 shows the uniformity ratio measured for OLED 1. Table 6 shows the uniformity ratio measured for OLED 1. The results again confirm that attachment of the OLED device sample to a hollow heat sink can improve the uniformity of the OLED device significantly.

TABLE 5

| | L to R | T to B |
|---|---|---|
| Horizontally operated with air convection | 30.3% | 29.8% |
| Horizontally operated with hollow heat sink | 10.1% | 15% |
| Horizontally operated with full heat sink | 29.8% | 38.5% |

TABLE 6

| | L to R | T to B |
|---|---|---|
| Horizontally operated with air convection | 40.6% | 30.3% |
| Horizontally operated with hollow heat sink | 11.4% | 8.7% |
| Horizontally operated with full heat sink | 28.2% | 30.2% |

The experimental testing results illustrate the fact that the luminance non-uniformity of OLED devices can be improved by properly removing the heat generated by the Joule heating at the periphery area of the panel of the OLED device. The non-uniformity of the emitting light on an OLED device is caused by the non-uniform distribution of the current. Therefore, in the embodiments described herein, a full heat sink cannot solve the non-uniform luminosity problem since a full heat sink only causes the temperature distribution on the surface of the OLED device to be uniform (instead of causing the temperature distribution on the surface of the OLED device) to have the shape of "Λ" (or, in some embodiments, substantially "Λ"). Only the hollow heat sink has the function to maintain the temperature distribution as the shape of "Λ" (or, in some embodiments, substantially "Λ").

As such, in some embodiments, it is likely that the luminance uniformity is related with the temperature distribution on the surface of the OLED devices. The uniformity of luminance can be improved if the temperature distribution on the surface of the panel of the OLED device can be controlled to have the shape of "Λ" (or, in some embodiments, substantially "Λ").

In some embodiments, properly choosing a cooling device for an OLED device can improve the light output efficacy and uniformity of luminance of the OLED device. A hollow heat sink can improve the luminance uniformity and increase the light output efficacy.

In some embodiments, the operating position of the panel of the OLED device can influence its light output efficacy and its uniformity of luminance. Normally, a panel, or an OLED device, that is operated in a vertical orientation has higher efficacy than a panel that is operated in a horizontal orientation. In the embodiment described, the OLED device 100 is the same as the described panel.

Figure 37:
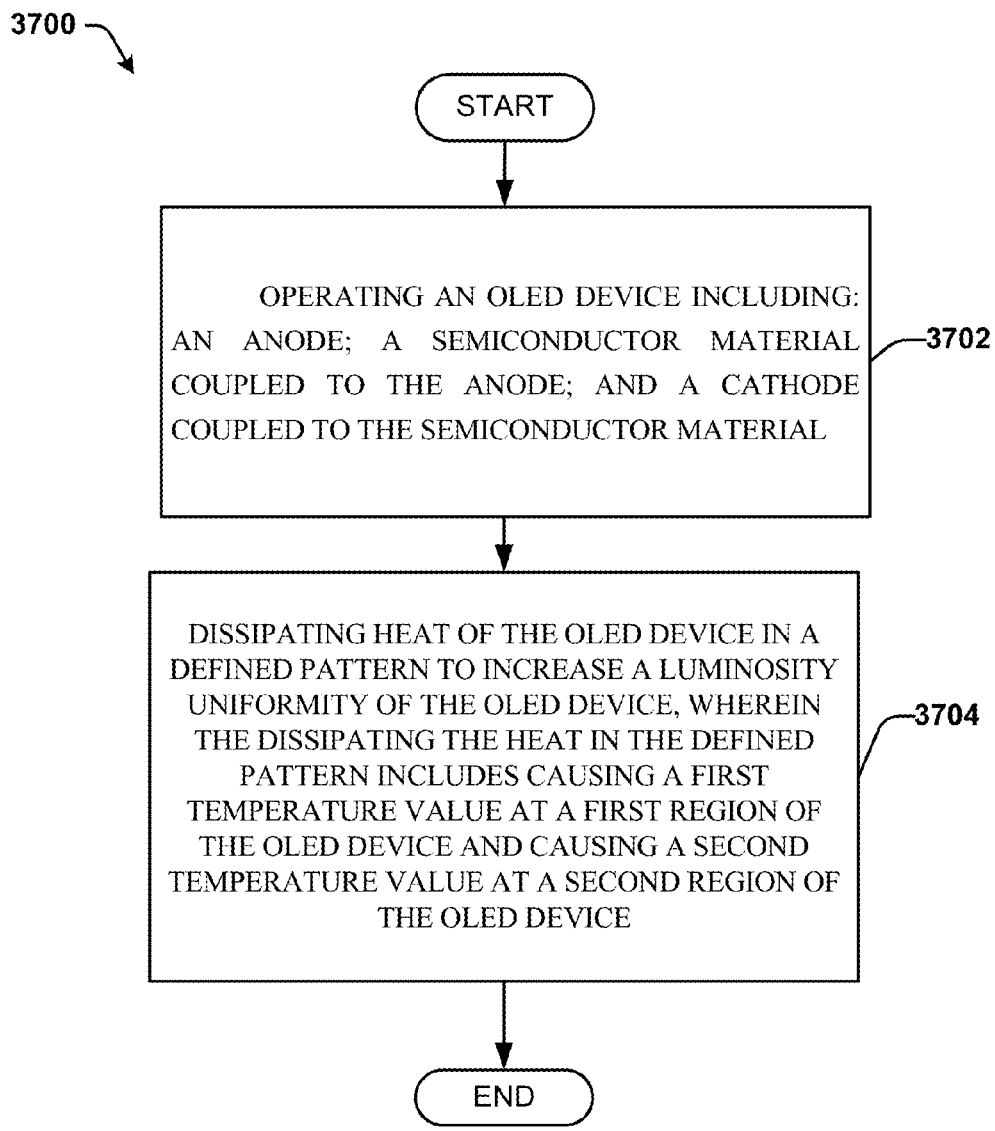
FIGS. 37, 38 and 39 are flow charts of methods of facilitating improved luminance uniformity of OLED devices, in accordance with embodiments described herein.
Figure 38:
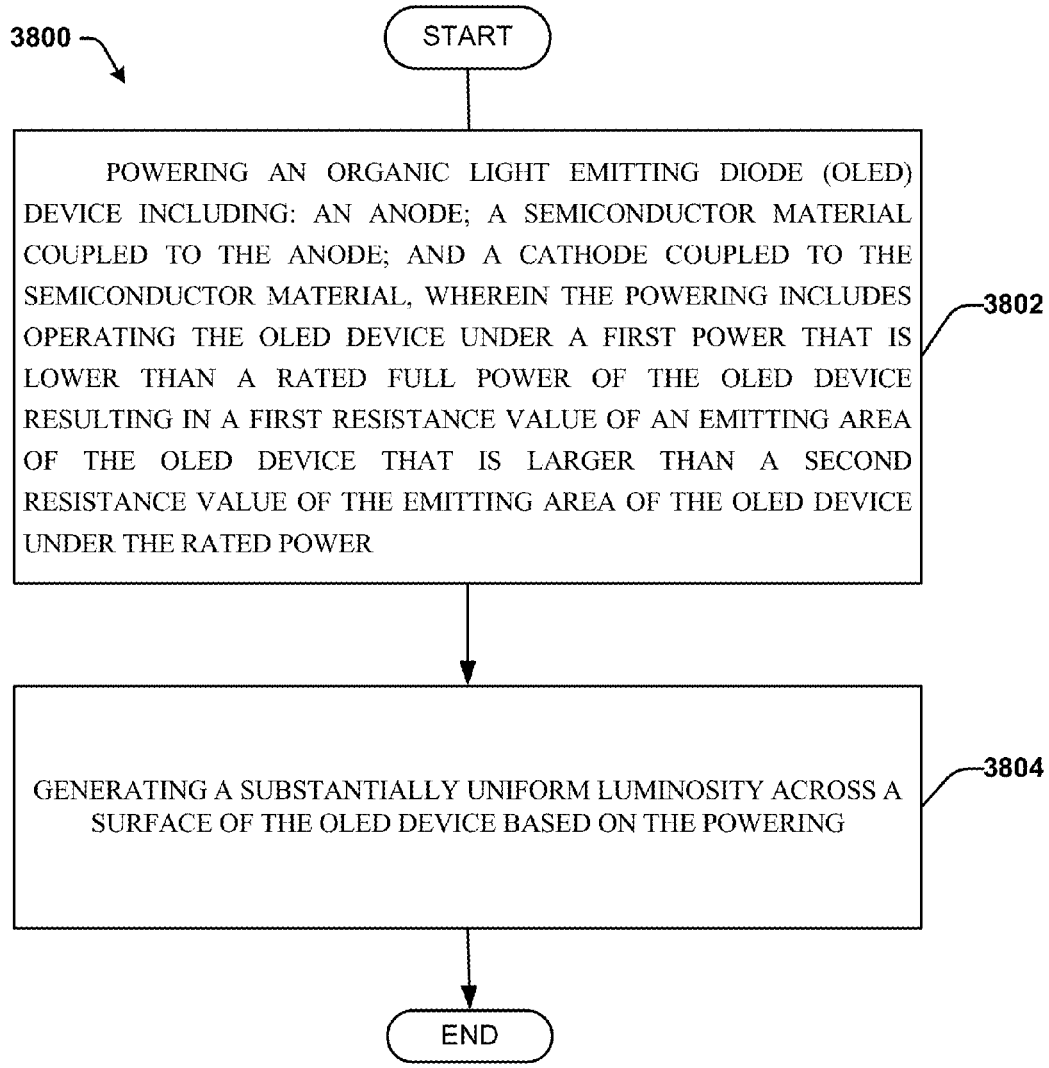
Figure 39:
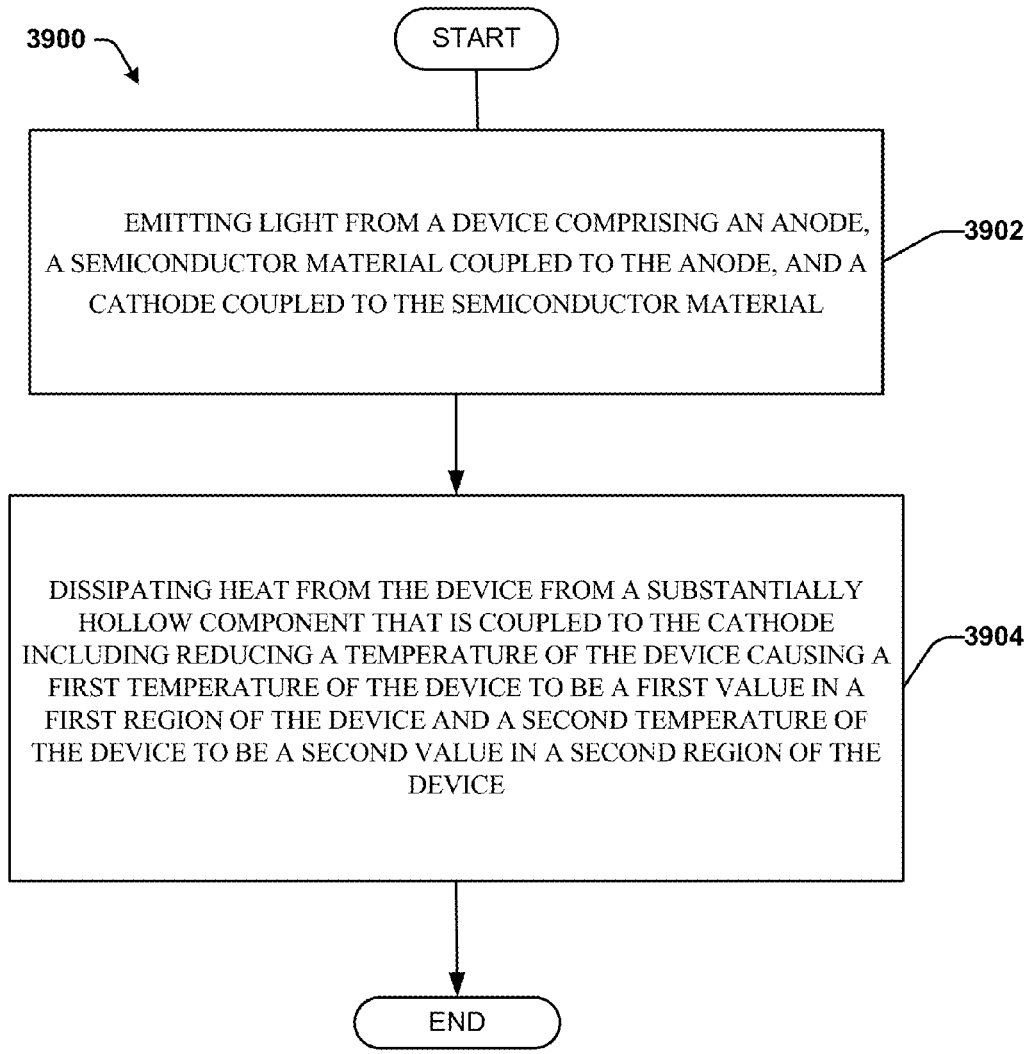

FIGS. 37, 38 and 39 are flow charts of methods of facilitating improved luminance uniformity in OLED devices, in accordance with embodiments described herein. Turning first to FIG. 37, at 3702, method 3700 can include operating an OLED device including: an anode; a semiconductor material coupled to the anode; and a cathode coupled to the semiconductor material. At 3704, method 3700 can include dissipating heat of the OLED device in a defined pattern to increase a luminosity uniformity of the OLED device, wherein the dissipating the heat in the defined pattern comprises causing a first temperature value at a first region of the OLED device and causing a second temperature value at a second region of the OLED device.

Turning now to FIG. 38, at 3802, method 3800 can include powering an organic light emitting diode (OLED) device including: an anode; a semiconductor material coupled to the anode; and a cathode coupled to the semiconductor material, wherein the powering comprises operating the OLED device under a first power that is lower than a rated full power of the OLED device resulting in a first resistance value of an emitting area of the OLED device that is larger than a second resistance value of the emitting area of the OLED device under the rated power. At 3804, method 3800 can include generating a substantially uniform luminosity across a surface of the OLED device based on the powering.

In some embodiments, the OLED device is positioned in a vertical orientation relative to a horizon axis. The vertical orientation can include an orientation having an angle between 80 degrees and 110 degrees relative to the horizon axis.

Turning now to FIG. 39, at 3902, method 3900 can include emitting light from a device including an anode, a semiconductor material coupled to the anode, and a cathode coupled to the semiconductor material. At 3904, method 3900 can include dissipating heat from the device from a substantially hollow component that is coupled to the cathode including reducing a temperature of the device causing a first temperature of the device to be a first value in a first region of the device and a second temperature of the device to be a second value in a second region of the device.

It can be understood that the embodiments described herein can be implemented in hardware, software or a combination thereof. For a hardware implementation, the embodiments (or modules thereof) can be implemented within one or more application specific integrated circuits (ASICs), mixed signal circuits, digital signal processors (DSPs), digital signal processing devices (DSPDs), programmable logic devices (PLDs), field programmable gate arrays (FPGAs), processors, controllers, micro-controllers, microprocessors and/or other electronic units designed to perform the functions described herein, or a combination thereof.

When the embodiments can be implemented in software, firmware, middleware or microcode, program code or code segments, they can be stored in a machine-readable medium (or a computer-readable medium), such as a storage component. A code segment can represent a procedure, a function, a subprogram, a program, a routine, a subroutine, a module, a software package, a class, or any combination of instructions, data structures, or program statements. A code segment can be coupled to another code segment or a hardware circuit by passing and/or receiving information, data, arguments, parameters, or memory contents.

What has been described above includes examples of one or more embodiments. It is, of course, not possible to describe every conceivable combination of components or methodologies for purposes of describing the aforementioned embodiments, but one of ordinary skill in the art may recognize that many further combinations and permutations of various embodiments can be possible. Accordingly, the described embodiments can be intended to embrace all such alterations, modifications and variations that fall within the spirit and scope of the appended claims. Furthermore, to the extent that the term "includes" can be used in either the detailed description or the claims, such term can be intended to be inclusive in a manner similar to the term "comprising" as "comprising" can be interpreted when employed as a transitional word in a claim.

What is claimed is:

1. A method, comprising:
   operating an organic light emitting diode (OLED) device comprising:
   an anode;
   a semiconductor material coupled to the anode; and
   a cathode coupled to the semiconductor material; and
   dissipating heat of the OLED device in a first defined pattern to increase a luminosity uniformity of the OLED device, wherein the dissipating the heat in the first defined pattern comprises causing a first temperature value at a first region of the OLED device and causing a second temperature value at a second region of the OLED device, wherein the dissipating the heat in the defined pattern comprises using a hollow heat sink to decrease a temperature of the OLED device, and wherein a magnitude of a voltage across a cross-section of the OLED device is in a second defined pattern that is a converse of the first defined pattern, wherein the second defined pattern comprises a group of values, wherein a least value of the group of values is located at a midpoint of the second defined pattern equidistant between two endpoints of the second defined pattern, wherein greatest values of the group of values are located at the two endpoints, and wherein the second defined pattern is V-shaped.

2. The method of claim 1, wherein the operating comprises operating the OLED device in a substantially vertical orientation.

3. The method of claim 1, wherein the first region is a first peripheral region of the OLED device.

4. The method of claim 3, wherein the OLED device further comprises a third region, and wherein the third region is a second peripheral region of the OLED device substantially opposite the first peripheral region.

5. The method of claim 4, wherein the first region and the third region circumscribe the second region.

6. The method of claim 1, wherein the second region is a center region of the OLED device.

7. The method of claim 1, wherein the first temperature value is less than the second temperature value.

8. The method of claim 1, wherein the decrease of the temperature of the OLED device comprises the decrease of the temperature to a third temperature value of the OLED device in a third region of the OLED device.

9. The method of claim 8, wherein the third temperature value is approximately equal to the first temperature value.

10. The method of claim 8, wherein a temperature distribution characterized by a change in temperature from the first temperature value to the second temperature value to the third temperature value is A-shaped from the first region to the second region to the third region.

11. The method of claim 8, wherein the hollow heat sink is substantially V-shaped and at least sized to span a surface of the OLED device from the first region.

12. The method of claim 8, wherein a temperature distribution characterized by a change in temperature from the first temperature value to the second temperature value to the third temperature value comprises an approximate shape according to a characteristic that the second temperature value is greater than the first and third temperature values, and wherein the hollow heat sink is substantially shaped as a converse shape of the shape of the temperature distribution.

13. The method of claim 8, wherein the heat sink is substantially V-shaped and at least sized to span a surface of the OLED device from the first region.

14. The method of claim 1, wherein the OLED device is positioned in a vertical orientation relative to a horizontal axis.

15. The method of claim 14, wherein the vertical orientation comprises an orientation having an angle between about 80 degrees and about 110 degrees relative to the horizontal axis.

16. A method, comprising:
operating an organic light emitting diode (OLED) device comprising:
an anode;
a semiconductor material coupled to the anode; and
a cathode coupled to the anode; and
dissipating heat of the OLED device in a first defined pattern to increase a luminosity uniformity of the OLED device, wherein the dissipating the heat in the first defined pattern comprises causing a first temperature value at a first region of the OLED device and causing a second temperature value at a second region of the OLED device, and wherein the dissipating the heat in the defined pattern comprises using a heat sink directly connected to the cathode to decrease a temperature of the OLED device, wherein a magnitude of a voltage across a cross-section of the OLED device is in a second defined pattern that is a converse of the first defined pattern, wherein the second defined pattern has a plurality of values and a first value of the plurality of values is located between two endpoints of the second defined pattern, wherein the two endpoints have second and third values of the plurality of values that are greater than the first value, and wherein the second defined pattern is V-shaped.

17. The method of claim 16, wherein the operating comprises operating the OLED device in a substantially vertical orientation.

18. The method of claim 17, wherein the OLED device further comprises a third region, and wherein the third region is a second peripheral region of the OLED device substantially opposite the first peripheral region.

19. The method of claim 16, wherein the first region is a first peripheral region of the OLED device.

20. A method, comprising:
operating an organic light emitting diode (OLED) device comprising:
an anode;
a semiconductor material coupled to the anode; and
a cathode coupled to the anode; and
dissipating heat of the OLED device in a defined pattern to increase a luminosity uniformity of the OLED device, wherein the dissipating the heat in the defined pattern comprises causing a first temperature value at a first region of the OLED device and causing a second temperature value at a second region of the OLED device, wherein the dissipating the heat in the defined pattern comprises using a heat sink comprising oil to decrease a temperature of the OLED device, wherein a voltage across the OLED device is in a second defined pattern, and wherein a least value of a plurality of values of the second defined pattern is located at a location between two endpoints of the second defined pattern.

21. The method of claim 20, wherein the vertical orientation comprises an orientation having an angle between about 80 degrees and about 110 degrees relative to the horizontal axis.

* * * * *